US009905554B2

(12) United States Patent
Hoshi et al.

(10) Patent No.: US 9,905,554 B2
(45) Date of Patent: Feb. 27, 2018

(54) SILICON CARBIDE SEMICONDUCTOR DEVICE AND METHOD OF MANUFACTURING THE SAME

(71) Applicant: FUJI ELECTRIC CO., LTD., Kanagawa (JP)

(72) Inventors: Yasuyuki Hoshi, Matsumoto (JP); Yuichi Harada, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/279,450

(22) Filed: Sep. 29, 2016

(65) Prior Publication Data

US 2017/0018545 A1  Jan. 19, 2017

Related U.S. Application Data

(63) Continuation-in-part of application No. PCT/JP2015/073388, filed on Aug. 20, 2015.

(30) Foreign Application Priority Data

Oct. 15, 2014  (JP) .................................. 2014-210360

(51) Int. Cl.
*H01L 27/06* (2006.01)
*H01L 21/04* (2006.01)
(Continued)

(52) U.S. Cl.
CPC ........ *H01L 27/0617* (2013.01); *H01L 21/046* (2013.01); *H01L 21/8213* (2013.01);
(Continued)

(58) Field of Classification Search
CPC ............... H01L 27/0617; H01L 21/046; H01L 29/1608; H01L 29/78; H01L 29/808
See application file for complete search history.

(56) References Cited

U.S. PATENT DOCUMENTS

| | | | |
|---|---|---|---|
| 6,054,752 | A | 4/2000 | Hara et al. |
| 2006/0118812 | A1 | 6/2006 | Ohtsuka et al. |
| 2009/0200559 | A1 | 8/2009 | Suzuki et al. |
| 2015/0115285 | A1 | 4/2015 | Kinoshita et al. |
| 2017/0133466 | A1* | 5/2017 | Shiomi ............... H01L 29/1095 |

FOREIGN PATENT DOCUMENTS

| | | |
|---|---|---|
| JP | 11-354791 A | 12/1999 |
| JP | 2010050147 A | 3/2010 |

(Continued)

OTHER PUBLICATIONS

Office Action issued for counterpart Japanese Application 2016-554000, issued by the Japan Patent Office dated Apr. 4, 2017.

(Continued)

*Primary Examiner* — Evan Pert
*Assistant Examiner* — Changhyun Yi

(57) ABSTRACT

Provided are a silicon carbide semiconductor device that is capable of preventing breakdown voltage degradation in the edge termination structure and a method of manufacturing the same. The p-type regions 31, 32 and the p-type region 33, which serves as an electric field relaxation region and is connected to the first p-type base regions 10, are positioned under the step-like portion 40, and the bottom surfaces of the p-type regions 31, 32, 33 are substantially flatly connected to the bottom surface of the first p-type base regions 10. The first base regions have an impurity concentration of $4 \times 10^{17}$ $cm^{-3}$ or higher. The p-type region 33 is designed to have a lower impurity concentration than the first base regions 10 and higher than the p-type regions 31, 32. In this way, the breakdown voltage degradation in the edge termination structure 102 can be prevented.

6 Claims, 22 Drawing Sheets

(51) Int. Cl.

| | | |
|---|---|---|
| *H01L 21/82* | (2006.01) | |
| *H01L 29/16* | (2006.01) | |
| *H01L 29/78* | (2006.01) | |
| *H01L 29/06* | (2006.01) | |
| *H01L 29/12* | (2006.01) | |
| *H01L 29/66* | (2006.01) | |
| *H01L 29/10* | (2006.01) | |
| *H01L 29/808* | (2006.01) | |
| *H01L 29/08* | (2006.01) | |

(52) U.S. Cl.
CPC .......... *H01L 29/06* (2013.01); *H01L 29/0615* (2013.01); *H01L 29/0661* (2013.01); *H01L 29/1095* (2013.01); *H01L 29/12* (2013.01); *H01L 29/1608* (2013.01); *H01L 29/66068* (2013.01); *H01L 29/78* (2013.01); *H01L 29/7811* (2013.01); *H01L 29/0878* (2013.01); *H01L 29/808* (2013.01)

(56) References Cited

FOREIGN PATENT DOCUMENTS

| | | |
|---|---|---|
| JP | 2010-147222 A | 7/2010 |
| JP | 2013-232564 A | 11/2013 |

OTHER PUBLICATIONS

International Search Report for International Application No. PCT/JP2015/073388, issued by the Japan Patent Office dated Nov. 17, 2015.

K. Shenai et al., "Optimum Semiconductors for High-Power Electronics," IEEE Transactions on Electron Devices, Sep. 1989, vol. 36, No. 9, p. 1811-1823.

Jayant Baliga, "Silicon Carbide Power Devices," United States of America, WorldScientific Publishing Co., Mar. 30, 2006, p. 61.

\* cited by examiner

SILICON CARBIDE SEMICONDUCTOR DEVICE AND METHOD OF MANUFACTURING THE SAME

The contents of the following Japanese patent applications are incorporated herein by reference:
No. 2014-210360 filed on Oct. 15, 2014, and
No. PCT/JP2015/073388 filed on Aug. 20, 2015.

BACKGROUND

1. Technical Field

The present invention relates to a silicon carbide semiconductor device using a wide band gap substrate and a method of manufacturing the same.

2. Related Art

In the conventional art, power semiconductor devices designed to control high voltage and current is made of silicon (Si). There are a plurality of types of power semiconductor devices, such as bipolar transistors, insulated gate bipolar transistors (IGBTs) and insulated gate field effect transistors (MOSFETs), which are used in different and suitable applications.

For example, bipolar transistors and IGBTs exhibit higher current density and can deal with higher current than MOSFETs, but cannot realize high-speed switching. Specifically speaking, in use, the limit of the switching frequency is approximately several kilohertz for the bipolar transistors and approximately several dozen kilohertz for the IGBTs. On the other hand, the power MOSFETs exhibit lower current density than the bipolar transistors and IGBTs and have difficulties in dealing with high current, but can realize high-speed switching of up to approximately several megahertz.

The market strongly demands power semiconductor devices that can operate with both high current and high speed. To fulfill the demand, a lot of efforts have been made to improve the IGBTs and power MOSFETs. At present, the IGBTs and power MOSFETs have been thoroughly developed to almost reach the performance limit of silicon. Among such efforts, silicon carbide (SiC) is the semiconductor material that has been attracting attention as it can be used to fabricate (manufacture) next-generation power semiconductor devices that exhibit low on-voltage, excellent high-speed characteristics and favorable high-temperature characteristics (see, for example, K. Shenai et al., Optimum Semiconductors For High-Power Electronics, IEEE Transactions on Electron Devices, September 1989, Vol. 36, No. 9, p. 1811-1823).

Silicon carbide is a chemically very stable semiconductor material. Having a wide band gap of 3 eV, silicon carbide can be utilized very stably as a semiconductor even at high temperatures. Furthermore, since the maximum electric field intensity of silicon carbide is by one or more orders of magnitude higher than that of silicon, silicon carbide is expected to be used as a semiconductor material that can realize both high breakdown voltage and low on-resistance. The above-described features of silicon carbide are also possessed by semiconductors having a wide band gap (hereinafter, referred to as the wide band gap semiconductors), for example, gallium nitride (GaN). Some semiconductor devices have been disclosed that use such wide band gap semiconductors in order to realize higher breakdown voltage (see, for example, B. Jayant Baliga, Silicon Carbide Power Devices, United States of America, WorldScientific Publishing Co., Mar. 30, 2006, p. 61).

In a high breakdown voltage semiconductor device, a high voltage is applied not only to the active region in which the element structure is formed but also to the edge termination structure that surrounds the active region and is designed to maintain the breakdown voltage. As a result, the electric fields concentrate in the edge termination structure. The breakdown voltage of the high breakdown voltage semiconductor device is determined by the impurity concentration, the thickness and the electric field intensity of the semiconductor. The tolerance to breakdown determined in the above manner by the unique features of the semiconductor is equal between the active region and the edge termination structure. Therefore, if the electric fields concentrate in the edge termination structure, the electric load imposed on the edge termination structure may exceed the tolerance to breakdown, which may possibly cause the edge termination structure to break down.

Some disclosed high breakdown voltage semiconductor devices achieve enhanced breakdown voltage by relaxing or diffusing the electric fields in the edge termination structure. Such semiconductor devices include a termination structure such as junction termination extension (JTE) structure and a floating field limiting ring (FLR) structure formed in the edge termination structure. Also, a disclosed semiconductor device has achieved improved reliability by arranging a floating metal electrode that is adjacent to the FLR as a field plate (FP) in order to cause the electric charges generated in the edge termination structure to be released (see, for example, Japanese Patent Application Publications Nos. 2010-50147 and 2006-165225).

FIG. 22 is a cross-sectional view showing the main constituents of a conventional silicon carbide semiconductor device 200. The silicon carbide semiconductor device 200 is, for example, an N-channel MOSFET, which is a switching device. In the following description, silicon carbide may be referred to as SiC.

The silicon carbide semiconductor device 200 includes a n-type SiC layer 52 on the front surface of an n-type SiC substrate 51, a plurality of p-type regions 60 on the front surface side of the n-type SiC layer 52, and a p-type SiC layer 61 arranged on the p-type regions 60. The silicon carbide semiconductor device 200 further includes an n-type region 62, which serves as a junction field effect transistor (JFET) region, arranged in the p-type SiC layer 61 so as to be positioned on a portion of the n-type SiC layer 52 in which the p-type region 60 is not formed, and an n-type source region 54 and a p-type contact region 55 in the p-type SiC layer 61. The silicon carbide semiconductor device 200 includes a source electrode 58 on the front surfaces of the n-type source region 54 and the p-type contact region 55.

The silicon carbide semiconductor device 200 also includes a gate electrode 57 arranged on the front surface of a portion of the p-type SiC layer 61 that is sandwiched between the n-type source region 54 and the n-type region 62 with a gate insulator 56 placed between the gate electrode 57 and the front surface of the p-type SiC layer 61, and a drain electrode 59 arranged on the back surface of the n-type SiC substrate 51.

In the above-described silicon carbide semiconductor device 200, if a voltage equal to or lower than the gate threshold is applied to the gate electrode 57 while a positive voltage with respect to the source electrode 58 is being applied to the drain electrode 59, the p-n junction between the p-type region 60 and the n-type SiC layer 52 or between the p-type SiC layer 61 and the n-type region 62 is reverse-biased. Thus, breakdown does not occur in the active region 201 and no currents flow.

On the other hand, if a voltage equal to or higher than the gate threshold is applied to the gate electrode 57, an inversion layer (an n channel) is formed on the front surface of the p-type SiC layer 61 immediately below the gate electrode 57 and currents resultantly flow. In this manner, the silicon carbide semiconductor device 200 can operate as a switch based on the level of the voltage applied to the gate electrode 57.

In the edge termination structure 202 of the silicon carbide semiconductor device 200, the substrate is thinner due to the removal of the peripheral portion of the p-type SiC layer 61. P-type regions 81, 82 are provided in the thinner portion of the substrate. When a high voltage is applied, the horizontal high voltage is maintained at the bonding portion between the p-type regions 81, 82 and the n-type SiC layer 52 in the region excluding the active region 201. The edge termination structure 202 is positioned outside a step-like portion 90.

In the silicon carbide semiconductor device 200 shown in FIG. 22, however, if a high voltage is applied to the drain electrode 59 under such a condition that the p-type region 60 has a lower impurity concentration than the p-type regions 81, 82, the electric fields are unequally shared between the p-type regions 81, 82 and the p-type region 60, which sandwich the step-like portion 90 therebetween. This may resultantly lower the breakdown voltage in the step-like portion 90. The breakdown voltage is also lowered by the shape of the step-like portion 90 created by the etching of the p-type SiC layer 61 and the varying impurity concentrations in the front surfaces of the p-type regions 81, 82.

In addition, if the bottom surfaces of the p-type regions 81, 82 are located deeper than the bottom surface of the p-type region 60 as shown in FIG. 22, a portion of the n-type SiC layer 52 that is positioned under the p-type regions 81, 82 has a small thickness. Accordingly, the p-type regions 81, 82 are highly likely to experience avalanche and the edge termination structure 202 thus exhibits a lower breakdown voltage than the active region 201. Furthermore, since the edge termination structure 202 has a smaller area than the active region 201, the avalanche generates excessively high current density and easily causes avalanche breakdown in the edge termination structure 202.

It is speculated that the structures disclosed in Patent Documents 1 and 2 are likely to experience avalanche and resultantly breakdown voltage degradation not in the active region but in the edge termination structure, which includes the step-like portion, due to the narrow width of the n-type drift layer under the step-like portion.

The object of the present invention is to solve the above-described problems and to provide a silicon carbide semiconductor device that is capable of preventing breakdown voltage degradation in the edge termination structure and a method of manufacturing the same.

SUMMARY

A silicon carbide semiconductor device may include a silicon carbide substrate of a first conductivity type. The silicon carbide semiconductor device may include a first silicon carbide epitaxial layer. The first silicon carbide epitaxial layer may be arranged on a front surface of the silicon carbide substrate and configured to serve as a first drift region of the first conductivity type having a lower impurity concentration than the silicon carbide substrate. The silicon carbide semiconductor device may include a plurality of first base regions of a second conductivity type. The plurality of first base regions of the second conductivity type may be arranged in a front surface layer of the first silicon carbide epitaxial layer. The silicon carbide semiconductor device may include a second base region of the second conductivity type, a source region of the first conductivity type, and a contact region of the second conductivity type. The second base region of the second conductivity type, the source region of the first conductivity type and the contact region of the second conductivity type may be arranged on the first base regions. The contact region of the second conductivity type may have a higher concentration than the second base region. The silicon carbide semiconductor device may include a second drift region of the first conductivity type. The second drift region of the first conductivity type may be sandwiched between the second base regions and arranged on a portion of the first silicon carbide epitaxial layer sandwiched between the first base regions. The silicon carbide semiconductor device may include a gate electrode. The gate electrode may be arranged on a portion of the second base region sandwiched between the source region and the second drift region with a gate insulator being placed between the second base region and the gate electrode. The silicon carbide semiconductor device may include a source electrode. The source electrode may be electrically connected to the source region and the contact region. The silicon carbide semiconductor device may include a drain electrode. The drain electrode may be electrically connected to the silicon carbide substrate. The silicon carbide semiconductor device may include a step-like portion. The step-like portion may be arranged at a peripheral portion of the second base region and located deeper than a bottom surface of the second base region and shallower than a bottom surface of the first base regions. The silicon carbide semiconductor device may include a a first semiconductor region of the second conductivity type (a p-type region 33). The first semiconductor region of the second conductivity type (the p-type region 33) may be arranged in the front surface layer of the first silicon carbide epitaxial layer and in contact with the step-like portion, the second base region and the first base regions. The silicon carbide semiconductor device may include a second semiconductor region of the second conductivity type (a p-type region 31). The second semiconductor region of the second conductivity type (the p-type region 31) may be arranged in the front surface layer of the first silicon carbide epitaxial layer under a bottom surface of the step-like portion and in contact with the first semiconductor region. The silicon carbide semiconductor device may include a third semiconductor region of the second conductivity type (a p-type region 32). The third semiconductor region of the second conductivity type (the p-type region 32) may be arranged in the front surface layer of the first silicon carbide epitaxial layer under the bottom surface of the step-like portion and in contact with the second semiconductor region. A bottom surface of the first semiconductor region and the bottom surface of the first base regions may be substantially flatly connected together. The first semiconductor region, the second semiconductor region and the third semiconductor region may have a lower impurity concentration than the first base regions. The first semiconductor region may have a higher impurity concentration than the second semiconductor region and the third semiconductor region. The first base regions may have an impurity concentration of no less than $4\times10^{17}$ cm$^{-3}$ and no more than $1\times10^{18}$ cm$^{-3}$.

The differences among the depths of the bottom surface of the first base regions, the first semiconductor region, the second semiconductor region and the third semiconductor region may be within a range of +−0.1 μm. The first semiconductor region may have an impurity concentration of no less than $2 \times 10^{16}$ cm$^{-3}$ and no more than $1 \times 10^{17}$ cm$^{-3}$. The second semiconductor region and the third semiconductor region may have an impurity concentration of no less than $1 \times 10^{16}$ cm$^{-3}$ and no more than $9 \times 10^{16}$ cm$^{-3}$.

A method of manufacturing a silicon carbide semiconductor device may include forming a plurality of first base regions of a second conductivity type, a first semiconductor region of the second conductivity type, a second semiconductor region of the second conductivity type, and a third semiconductor region of the second conductivity type in such a manner that the first base regions, the first semiconductor region, the second semiconductor region and the third semiconductor region are in contact with each other. In this forming step, selective ion implantation may be performed on a front surface layer of a first silicon carbide epitaxial layer of a first conductivity type, which is configured to serve as a first drift region. The method of manufacturing a silicon carbide semiconductor device may include forming a bottom surface of the first semiconductor region and bottom surface of the first base regions in such a manner that the bottom surface of the first semiconductor region is substantially flatly connected to the bottom surface of the first base regions. The method of manufacturing a silicon carbide semiconductor device may include forming a second silicon carbide epitaxial layer of the second conductivity type on the first silicon carbide epitaxial layer. The method of manufacturing a silicon carbide semiconductor device may include forming a source region of the first conductivity type and a contact region of the second conductivity type. In this forming step, selective ion implantation may be performed on a portion of the second silicon carbide epitaxial layer that is positioned on the first base regions. The method of manufacturing a silicon carbide semiconductor device may include forming a second drift region of the first conductivity type. In this forming step, ion implantation may be performed on a portion of the second silicon carbide epitaxial layer that is positioned on a portion of the first silicon carbide epitaxial layer sandwiched between the first base regions. The method of manufacturing a silicon carbide semiconductor device may include treating a portion of the second silicon carbide epitaxial layer that is not exposed to the ion implantation as a second base region. The method of manufacturing a silicon carbide semiconductor device may include etching away a portion of the second silicon carbide epitaxial layer that is formed on a peripheral portion of the first silicon carbide epitaxial layer, the first semiconductor region, the second semiconductor region and the third semiconductor region. The method of manufacturing a silicon carbide semiconductor device may include forming a step-like portion in the first semiconductor region. The step-like portion may be located deeper than a bottom surface of the second silicon carbide epitaxial layer and shallower than a bottom surface of the first base region. The first semiconductor region, the second semiconductor region and the third semiconductor region may have a lower impurity concentration than the first base regions. The first semiconductor region may have a higher impurity concentration than the second semiconductor region and the third semiconductor region. The first base regions may have an impurity concentration of no less than $4 \times 10^{17}$ cm$^{-3}$ and no more than $1 \times 10^{18}$ cm$^{-3}$.

A method of manufacturing a silicon carbide semiconductor device may include forming a plurality of first base regions of a second conductivity type, a second semiconductor region of a second conductivity type that is spaced away from the first base regions and a third semiconductor region of the second conductivity type that is adjacent to the second semiconductor region. In this forming step, selective ion implantation may be performed on a front surface layer of a first silicon carbide epitaxial layer of a first conductivity type, which is configured to serve as a first drift region. The method of manufacturing a silicon carbide semiconductor device may include forming a second silicon carbide epitaxial layer of the second conductivity type on the first silicon carbide epitaxial layer. The method of manufacturing a silicon carbide semiconductor device may include forming a source region of the first conductivity type and a contact region of the second conductivity type. In this forming step, selective ion implantation may be performed on a portion of the second silicon carbide epitaxial layer that is positioned on the first base regions. The method of manufacturing a silicon carbide semiconductor device may include forming a second drift region of the first conductivity type. In this forming step, ion implantation may be performed on a portion of the second silicon carbide epitaxial layer that is positioned on a portion of the first silicon carbide epitaxial layer sandwiched between the first base regions. The method of manufacturing a silicon carbide semiconductor device may include treating a portion of the second silicon carbide epitaxial layer that is not exposed to the ion implantation as a second base region. The method of manufacturing a silicon carbide semiconductor device may include etching away a portion of the second silicon carbide epitaxial layer that is more outside than an edge of the first base regions. The method of manufacturing a silicon carbide semiconductor device may include forming a step-like portion between the first base regions and the second semiconductor region. In this forming step, the step-like portion may be located deeper than a bottom surface of the second silicon carbide epitaxial layer and shallower than a bottom surface of the first base regions. The method of manufacturing a silicon carbide semiconductor device may include forming a first semiconductor region. In this forming step, the first semiconductor region may be formed in a portion of the front surface layer of the first silicon carbide epitaxial layer that is positioned under the step-like portion and connected to the first base regions, the second base region and the second semiconductor region. A bottom surface of the first semiconductor region may be substantially flatly connected to a bottom surface of the first base regions. The first semiconductor region, the second semiconductor region and the third semiconductor region may have a lower impurity concentration than the first base regions. The first semiconductor region may have a higher impurity concentration than the second semiconductor region and the third semiconductor region. The first base region may have an impurity concentration of no less than $4 \times 10^{17}$ cm$^{-3}$ and no more than $1 \times 10^{18}$ cm$^{-3}$.

The present invention can provide a silicon carbide semiconductor device that is capable of preventing breakdown voltage degradation in the edge termination structure and a method of manufacturing the same.

DESCRIPTION OF EXEMPLARY EMBODIMENTS

In the following embodiments, a first conductivity type denotes the n-type and a second conductivity type denotes the p-type. It goes without saying that the first and second conductivity types may be reversed. As used herein, the terms "on," "above" and "upper" refer to the direction that extends from a drain electrode 9 to a protective film 15 and is perpendicular to the substrate plane of an n-type silicon carbide substrate 1. The terms "under," "below" and "lower" refer to the opposite direction to the terms "on," "above" and "upper." In addition, the term "front surface" refers to the upper surface of the substrate, layer, region, electrode and film. The term "back surface" refers to the lower surface of the substrate, layer, region, electrode and film.

First Embodiment

Figure 1:
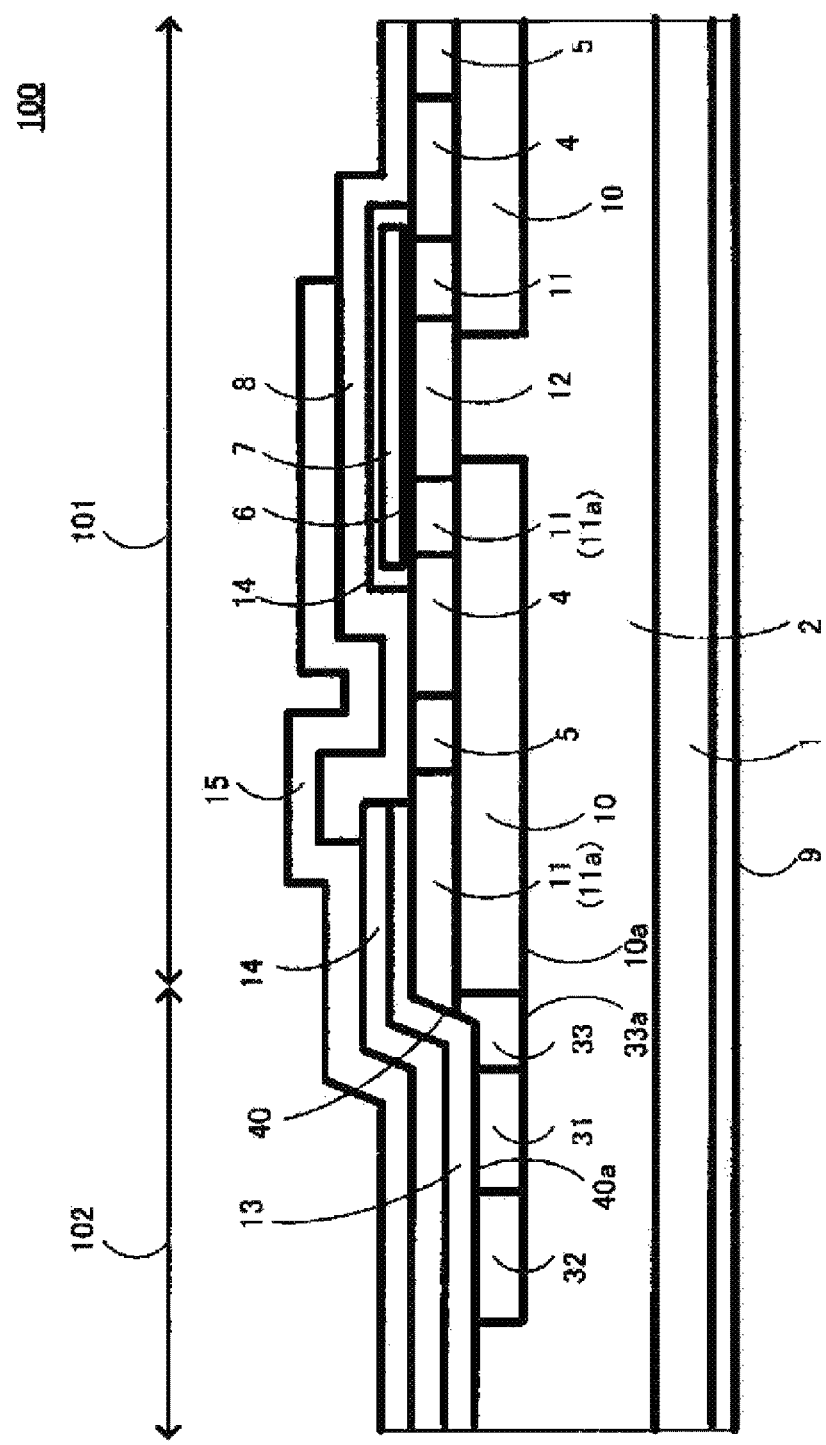
FIG. 1 is a cross-sectional view showing the main constituents of a silicon carbide semiconductor device 100 relating to a first embodiment of the present invention.

FIG. 1 is a cross-sectional view showing the main constituents of a silicon carbide semiconductor device 100 relating to a first embodiment of the present invention. In the drawing, the silicon carbide semiconductor device 100 is, for example, a vertical planar gate MOSFET.

The silicon carbide semiconductor device 100 includes a n-type silicon carbide substrate 1 that has a high impurity concentration and serves as a n-type drain layer, a n-type silicon carbide epitaxial layer 2 that is arranged on the front surface of the n-type silicon carbide substrate 1, has a lower impurity concentration than the n-type silicon carbide substrate 1 and serves as a first n-type drift region, and a first p-type base region 10 that is arranged in the front surface layer of the n-type silicon carbide epitaxial layer 2, formed by ion implantation and has a high impurity concentration. The silicon carbide semiconductor device 100 also includes a second p-type base region 11, a n-type source region 4, a p-type contact region 5 and a second n-type drift region 12, which are all arranged on the first p-type base region 10. The silicon carbide semiconductor device 100 includes a gate electrode 7 on a portion of the second p-type base region 11 that is sandwiched between the n-type source region 4 and the second n-type drift region 12, with a gate insulator 6 being placed between the gate electrode 7 and the second p-type base region 11. The silicon carbide semiconductor device 100 also includes an interlayer insulative film 14 arranged on the gate electrode 7, a source electrode 8 that is arranged on the interlayer insulative film 14 and connected to the n-type source region 4 and the p-type contact region 5, and a surface protective film 15 that covers the outmost surface.

In the edge termination structure 102, a step-like portion 40 is provided at the peripheral portion of the second p-type base region 11 and located deeper than the bottom surface of the second p-type base region 11. The second p-type base region 11 and the peripheral portion of the silicon carbide semiconductor device 100 is covered with the interlayer insulative film 14 with the thick insulative film 13 placed therebetween. Under the vicinity of the step-like portion 40, a p-type region 33 is provided that is in contact with the second p-type base region 11 and the first p-type base region 10 and arranged in the front surface layer of the n-type silicon carbide epitaxial layer 2. The silicon carbide semiconductor device 100 includes a p-type region 31 that is in contact with the p-type region 33 and positioned under a bottom surface 40a of the step-like portion 40 and a p-type region 32 that is adjacent to the p-type region 31 and positioned under the bottom surface 40a. The p-type region 33 is an electric field relaxation region that is designed to prevent breakdown voltage degradation in the step-like portion 40 and also serves as a junction terminal extension (JTE). The p-type regions 31, 32 form a junction terminal extension (JTE) for the edge termination structure 102.

The above-described n-type silicon carbide substrate 1 is, for example, a silicon carbide monocrystalline substrate doped with nitrogen (N). The n-type silicon carbide epitaxial layer 2 is an n-type drift layer (first n-type drift region) that has a lower impurity concentration than the n-type silicon carbide substrate 1 and is doped with, for example, nitrogen. The above-described first p-type base region 10 is, for example, doped with aluminum and has an impurity concentration of no less than $4\times10^{17}$ cm$^{-3}$ and no more than $1\times10^{18}$ cm$^{-3}$. The first p-type base region 10 has a depth of, for example, approximately 0.5 μm. The first p-type base regions 10 in FIG. 1 may be connected to each other in the peripheral portion of the silicon carbide semiconductor device 100. The second p-type base region 11 is, for example, a p-type silicon carbide epitaxial layer 11a doped with aluminum and has an impurity concentration of, for example, approximately $2\times10^{16}$ cm$^{-3}$ and a thickness of approximately 0.5 μm. The second n-type drift region 12 is a JFET region and formed by implanting nitrogen ions into the p-type silicon carbide epitaxial layer 11a, which is the second p-type base region 11. The second p-type base regions 11 in FIG. 1 may be connected to each other in the peripheral portion of the silicon carbide semiconductor device 100. The dosage of the ion implantation is controlled in such a manner that the second n-type drift region 12 has an impurity concentration of, for example, approximately $5.0\times10^{16}$ cm$^{-3}$. The second n-type drift region 12 has a thickness of, for example, approximately 0.6 μm. The n-type source region 4 has a higher impurity concentration than the second n-type drift region 12, for example, approximately $1\times10^{20}$ cm$^{-3}$. The gate insulator 6 has a thickness of, for example, approximately 100 nm. The interlayer insulative film 14 is a phospho silicate glass film and has a thickness of, for example, 1.0 μm. The source electrode 8 is, for example, an aluminum film containing approximately 1% of silicon (Al—Si film) and has a thickness of, for example, approximately 5 μm. The drain electrode 9, which is a back-surface electrode, is a multilayered film made of titanium, nickel and gold (Au), for example.

The above-described silicon carbide semiconductor device 100 includes the step-like portion 40 that is arranged at the peripheral portion of the second p-type base region 11 and located deeper than the bottom surface of the second p-type base region 11. For example, the step-like portion 40 is located at the depth of approximately 0.4 μm to 0.7 μm, or located deeper by approximately 0.1 μm than the second p-type base region 11. In the vicinity of the step-like portion 40, the p-type region 33 is provided to serve as an electric field relaxation region. The p-type region 33 is designed to have a lower impurity concentration than the first p-type base region 10 and a higher impurity concentration than the p-type regions 31, 32, which form the edge termination structure 102. Specifically speaking, the desirable impurity concentration for the p-type region 33 preferably ranges from $2\times10^{16}$ cm$^{-3}$ to $1\times10^{17}$ cm$^{-3}$. Furthermore, the impurity concentrations of the p-type regions 31, 32 are preferably lower than that of the adjacent p-type region 33 and preferably range from $1\times10^{16}$ cm$^{-3}$ to $9\times10^{16}$ cm$^{-3}$. The reason why the step-like portion 40 is located deeper than the depth of the second p-type base region 11 and shallower than the depth of the first p-type base region 10 is to allow the p-type regions 31, 32, which serve as a JTE, to be exposed at the bottom surface 40a of the step-like portion 40.

The bottom surface 10a of the first p-type base region 10 and the bottom surfaces of the p-type regions 31, 32 with the bottom surface 33a of the p-type region 33 therebetween are connected to each other substantially flatly. Here, they are considered to be substantially flatly connected to each other if the differences among the depths of their bottom surfaces are within the range of +−0.1 μm. As described above, the bottom surfaces of the p-type region 33 and the p-type regions 31, 32 and the bottom surface of the first p-type base region 10, which is positioned in the active region, are substantially flatly connected, and the p-type region 33 is controlled to have a lower impurity concentration than the first p-type base region 10. With such a configuration, the edge termination structure 102 can have a higher breakdown voltage than the active region 101, as a result of which avalanche always takes place in the first p-type base region 10. Generally speaking, when compared with the p-type regions 31, 32, 33, the first p-type base region 10 tends to have a higher tolerance to avalanche due to its larger area. For this reason, as designed in such a manner that breakdown always takes place in the first p-type base region 10, the silicon carbide semiconductor device 100 can effectively achieve higher avalanche tolerance. Furthermore, if the first p-type base region 10 is configured to have an impurity concentration of no less than $4\times10^{17}$ cm$^{-3}$ and no more than $1\times10^{18}$ cm$^{-3}$, breakdown voltage degradation is prevented in the edge termination structure 102. Accordingly, the silicon carbide semiconductor device 100 can achieve a high breakdown voltage of 1200 V, for example.

Figure 2:
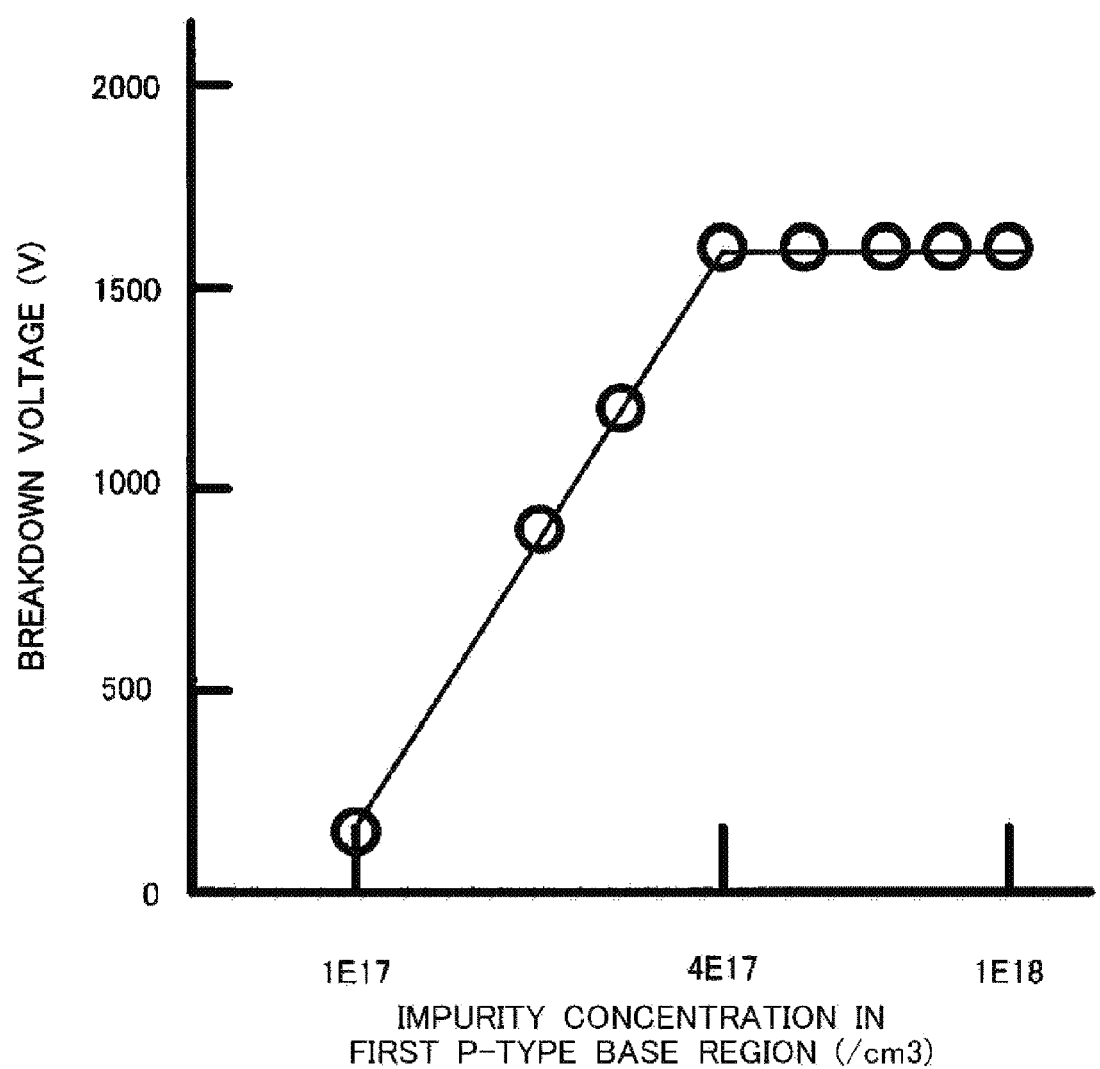
FIG. 2 shows how the impurity concentration in a first p-type base region is related to the breakdown voltage of a silicon carbide semiconductor device.

FIG. 2 shows how the impurity concentration in the first p-type base region is related to the breakdown voltage of the silicon carbide semiconductor device. The vertical axis represents the breakdown voltage and the horizontal axis represents the impurity concentration of the first p-type base region. The occurrence of avalanche is prevented in the edge termination structure 102 and a high breakdown voltage of higher than 1600 V can be achieved if the conditions such as the step-like portion 40 being located at the depth of 0.6 μm, the p-type region 33 having an impurity concentration of $1\times10^{17}$ cm$^{-3}$, and the p-type region 33 and the first p-type base region 10 having bottom surfaces flatly connected to each other are satisfied and the impurity concentration of the first p-type base region 10 is regulated to be no less than $4\times10^{17}$ cm$^{-3}$ and no more than $1\times10^{18}$ cm$^{-3}$. As a consequence, the silicon carbide semiconductor device 100 can accomplish a high breakdown voltage.

Second Embodiment

FIGS. 3 to 15 collectively show a method of manufacturing a silicon carbide semiconductor device 100 relating to a second embodiment of the present invention, specifically, cross-sectional views showing the steps of manufacturing the main constituents in the order performed.

Figure 3:
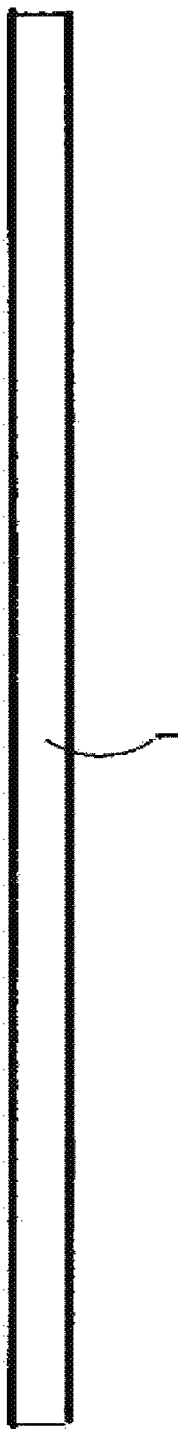
FIG. 3 is a cross-sectional view showing a step of manufacturing the main constituents of a silicon carbide semiconductor device 100 relating to a second embodiment of the present invention.

To start with, as shown in FIG. 3, a n-type silicon carbide substrate 1 is provided that is doped with nitrogen to have an impurity concentration of approximately $2 \times 10^{19}$ cm$^{-3}$, for example. The main surface of the n-type silicon carbide substrate 1 may be, for example, the (1000-1) plane that has an off angle of approximately 4 degrees in the <11-20> direction.

Figure 4:
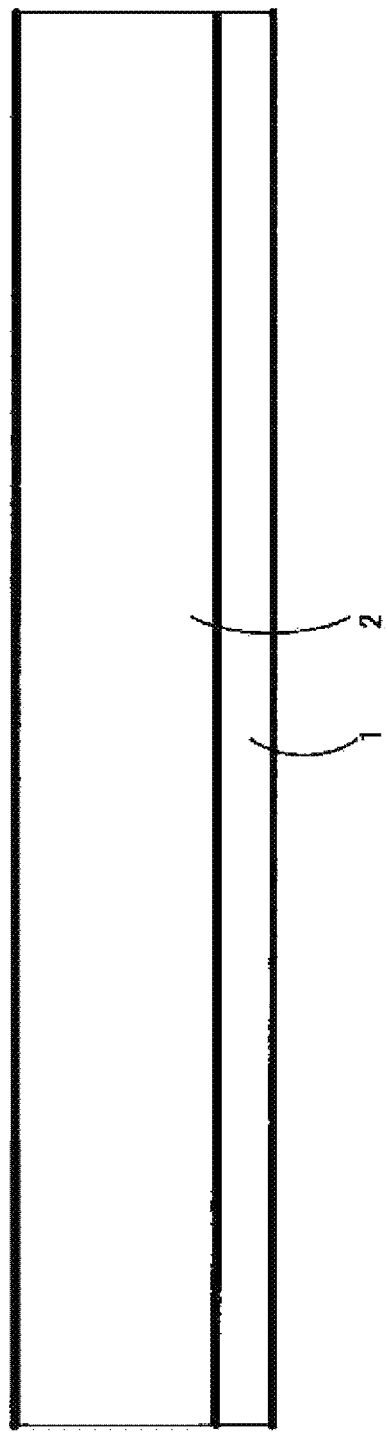
FIG. 4 continues from FIG. 3 and is a cross-sectional view showing a step of manufacturing the main constituents of the silicon carbide semiconductor device 100 relating to the second embodiment of the present invention.

Subsequently, as shown in FIG. 4, on the (000-1) plane of the n-type silicon carbide substrate 1, a n-type silicon carbide epitaxial layer 2 is grown that is doped with nitrogen to have an impurity concentration of approximately $1.0 \times 10^{16}$ cm$^{-3}$, has a thickness of approximately 10 μm, and is to serve as the first n-type drift region, for example.

Figure 5:
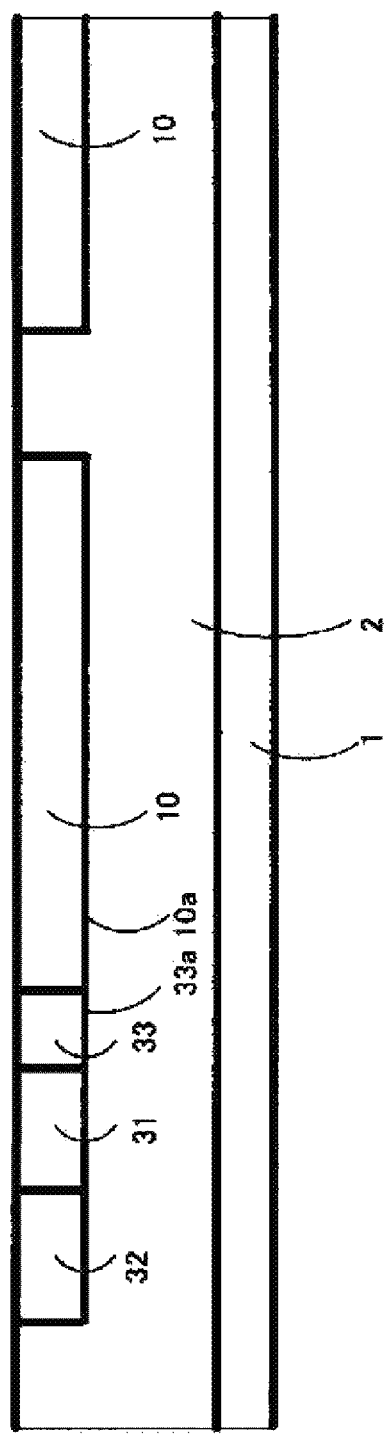
FIG. 5 continues from FIG. 4 and is a cross-sectional view showing a step of manufacturing the main constituents of the silicon carbide semiconductor device 100 relating to the second embodiment of the present invention.

Following this, as shown in FIG. 5, photolithography and ion implantation are performed to selectively form, in the front surface layer of the n-type silicon carbide epitaxial layer 2, the p-type regions 31, 32 of the edge termination structure 102, the first p-type base region 10 of the active region 101, and the p-type region 33 that is in contact with and positioned between the p-type region 31 and the first p-type base region 10 and to serve as an electric field relaxation region. In terms of the ion implantation, the dopant is aluminum, for example, and the dosage is determined so that the first p-type base region 10 has an impurity concentration of, for example, approximately $1.0 \times 10^{18}$ cm$^{-3}$. The impurity concentration of the p-type regions 31, 32 is controlled to be in the range of, for example, $1 \times 10^{16}$ cm$^{-3}$ to $9 \times 10^{16}$ cm$^{-3}$, and the impurity concentration of the p-type region 33 is controlled to be between the impurity concentration of the first p-type base region 10 and the impurity concentrations of the p-type regions 31, 32, and thus fall within the range of $2 \times 10^{16}$ cm$^{-3}$ to $1 \times 10^{17}$ cm$^{-3}$. The first p-type base region 10 has a depth of approximately 0.5 μm.

Figure 6:
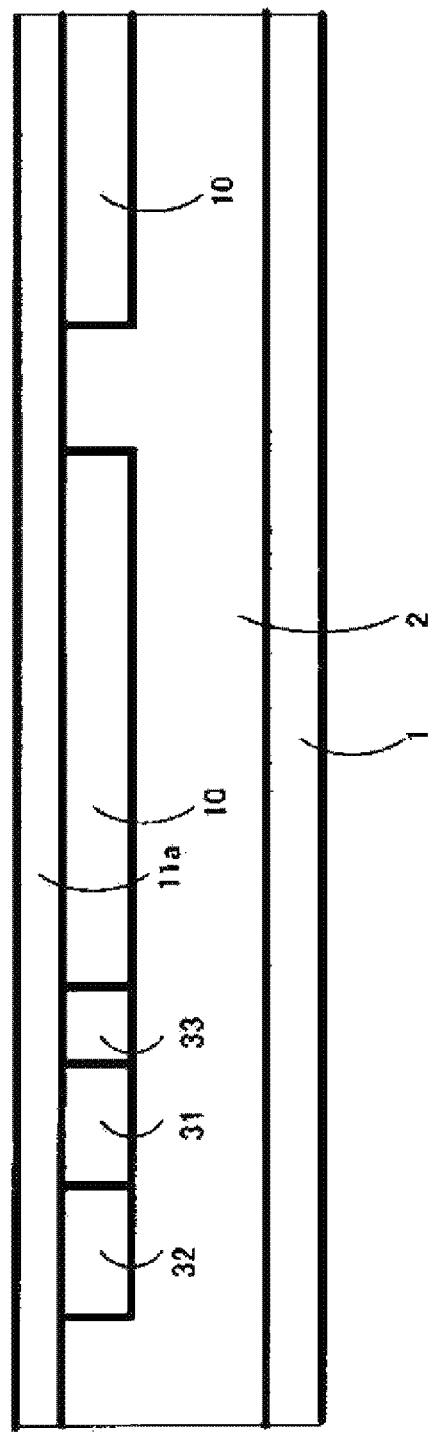
FIG. 6 continues from FIG. 5 and is a cross-sectional view showing a step of manufacturing the main constituents of the silicon carbide semiconductor device 100 relating to the second embodiment of the present invention.

After this, as shown in FIG. 6, on the front surface of the n-type silicon carbide epitaxial layer 2 in which the first p-type base region 10 is formed, a p-type silicon carbide epitaxial layer 11a, which is to serve as the second p-type base region 11, is grown to have, for example, a thickness of approximately 0.5 μm and an impurity concentration of approximately $2.0 \times 10^{16}$ cm$^{-3}$.

Figure 7:
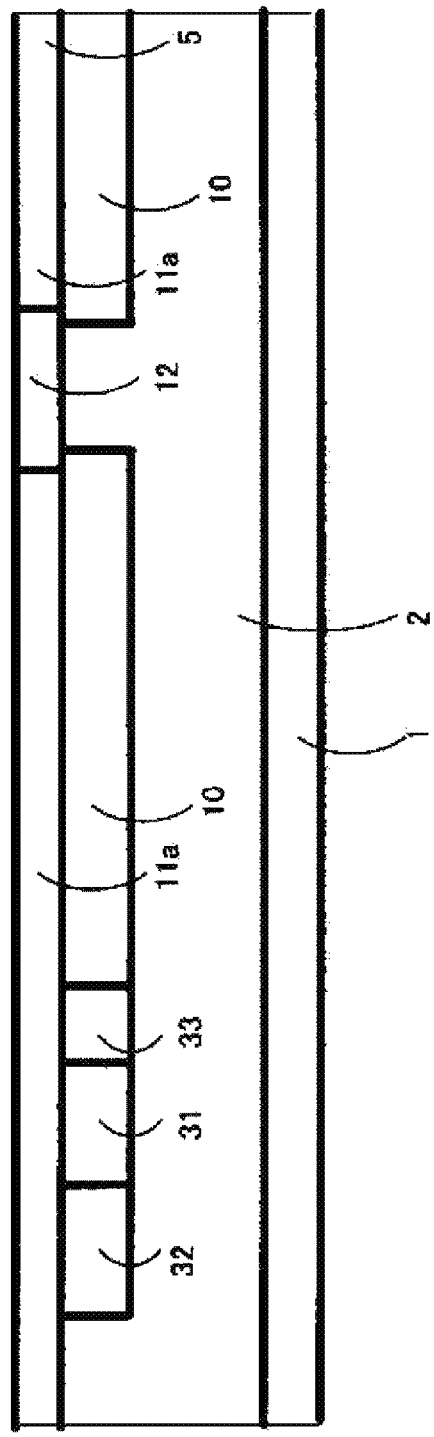
FIG. 7 continues from FIG. 6 and is a cross-sectional view showing a step of manufacturing the main constituents of the silicon carbide semiconductor device 100 relating to the second embodiment of the present invention.
Figure 10:
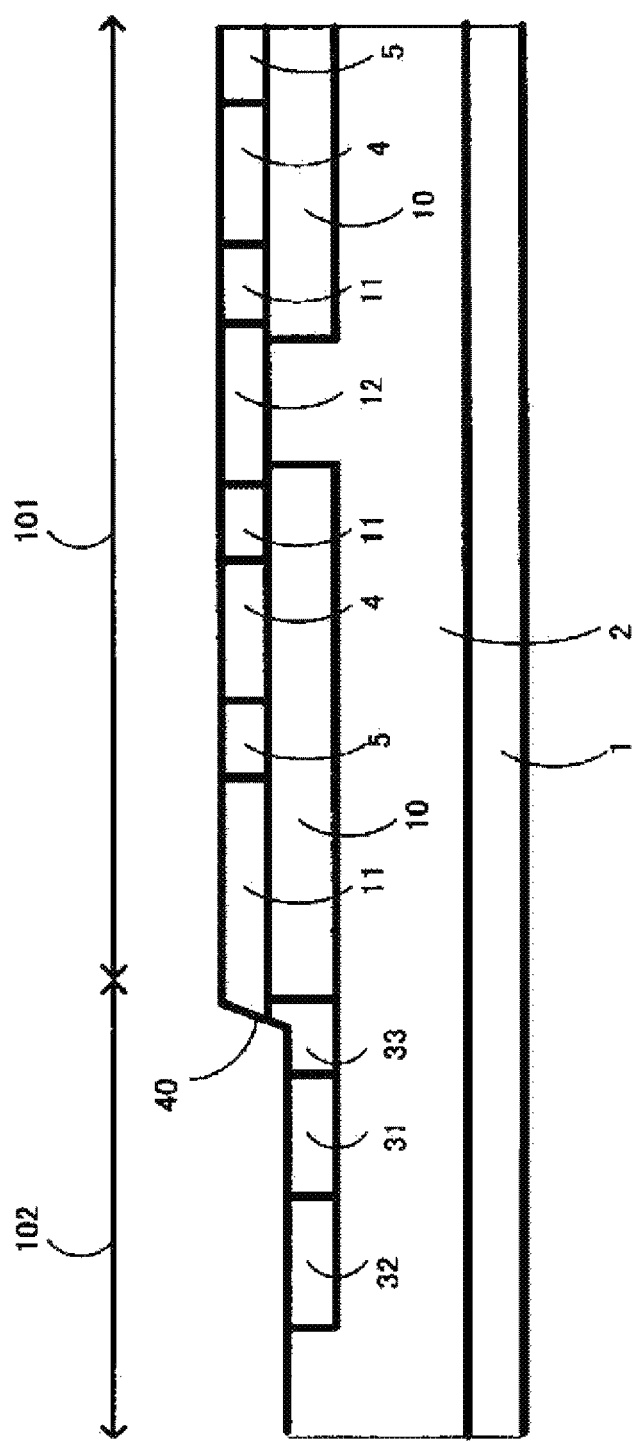
FIG. 10 continues from FIG. 9 and is a cross-sectional view showing a step of manufacturing the main constituents of the silicon carbide semiconductor device 100 relating to the second embodiment of the present invention.

Subsequently, as shown in FIG. 7, photolithography, ion implantation and the thermal treatment shown in FIG. 10 are performed to reverse the conductivity type of a portion of the p-type silicon carbide epitaxial layer 11a that is positioned on the portion of the n-type silicon carbide epitaxial layer 2 that is sandwiched between the first p-type base regions 10, to selectively form the second n-type drift region 12. In terms of the ion implantation, for example, the dopant is nitrogen and the dosage is determined so that the second n-type drift region 12 has an impurity concentration of approximately $5.0 \times 10^{16}$ cm$^{-3}$. The second n-type drift region 12 has a depth of, for example, approximately 0.6 μm.

Figure 8:
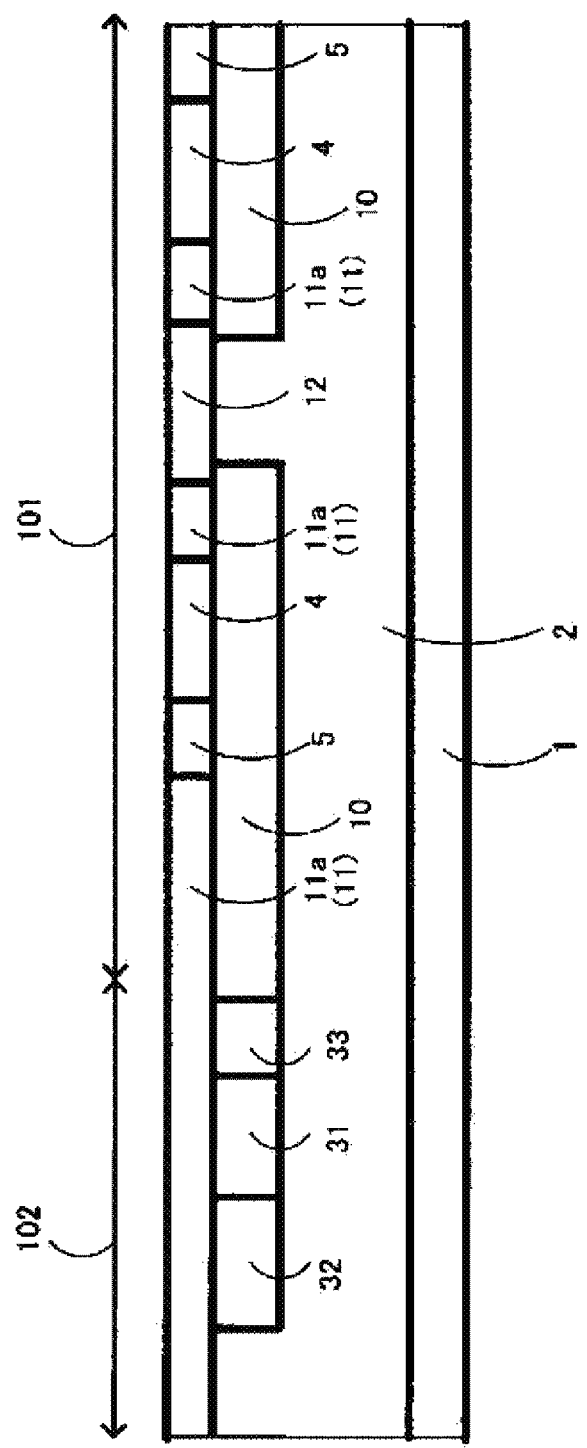
FIG. 8 continues from FIG. 7 and is a cross-sectional view showing a step of manufacturing the main constituents of the silicon carbide semiconductor device 100 relating to the second embodiment of the present invention.

Following this, as shown in FIG. 8, photolithography, ion implantation and the thermal treatment shown in FIG. 10 are performed to selectively form the n-type source region 4, which is spaced away from the second n-type drift region 12, in the p-type silicon carbide epitaxial layer 11a, which will serve as the p-type base region 11. After this, photolithography and ion implantation are performed to selectively form the p-type contact region 5, which is in contact with the n-type source region 4. In this way, in the direction from the edge termination structure 102 toward the active region 101, the second p-type base region 11, the p-type contact region 5, the n-type source region 4, the second p-type base region 11, the second n-type drift region 12, the second p-type base region 11, the n-type source region 4, the p-type contact region 5, and the second p-type base region 11 are formed in a repeated manner so as to be in contact with each other in the p-type silicon carbide epitaxial layer 11a.

Figure 9:
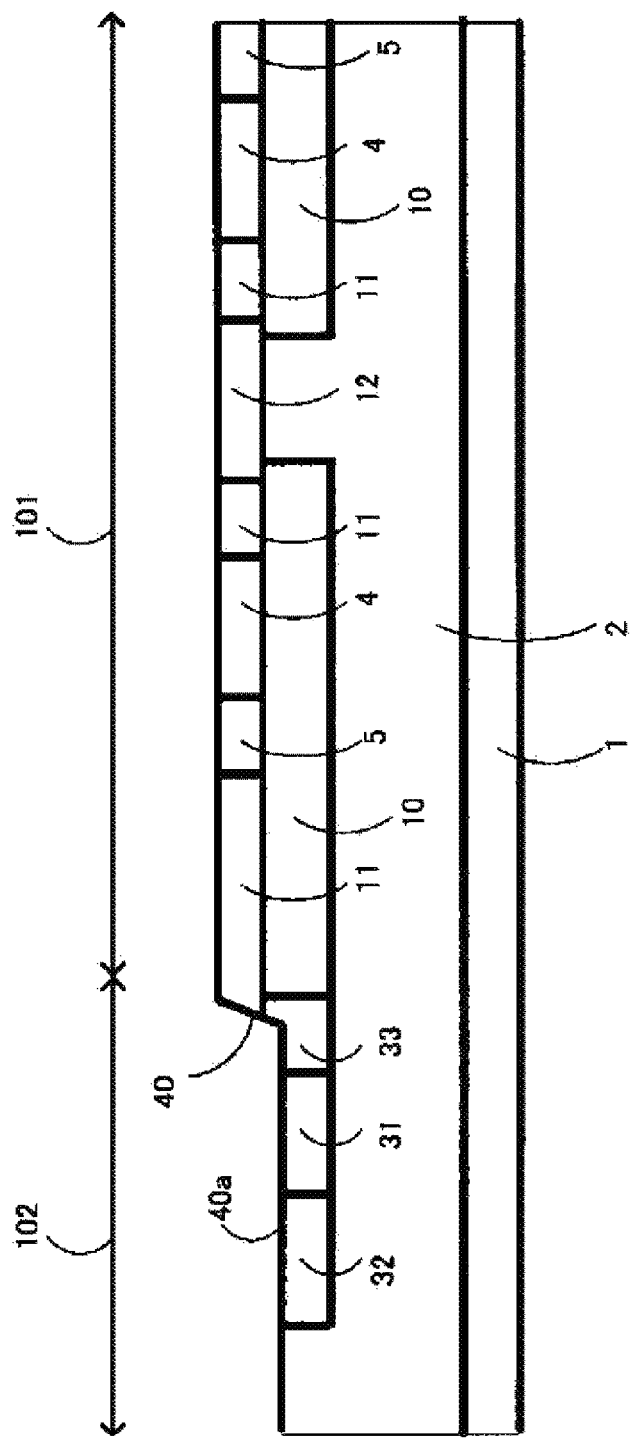
FIG. 9 continues from FIG. 8 and is a cross-sectional view showing a step of manufacturing the main constituents of the silicon carbide semiconductor device 100 relating to the second embodiment of the present invention.

Subsequently, as shown in FIG. 9, the p-type silicon carbide epitaxial layer 11a (the p-type base region 11) is subject to etching to such a depth that the p-type regions 31, 32, which are to serve as the edge termination structure 102, and part of the p-type region 33, which is to serve as an electric field relaxation region, are exposed. The etching depth is, for example, approximately 0.4 μm to 0.7 μm. As a result of the etching, the front surfaces of the p-type regions 31, 32, which are to serve as the edge termination structure, and the front surface of part of the p-type region 33, which is to serve as an electric field relaxation region, are located lower than the front surface of the active region 101. The step-like portion 40 is formed and positioned in the p-type region 33, and the p-type region 33 is connected to the first p-type base region 10 and the second p-type base region 11.

Following this, as shown in FIG. 10, thermal treatment (annealing) is performed to simultaneously activate the n-type source region 4, the p-type contact region 5, the second n-type drift region 12, the first p-type base region 10, the p-type regions 31, 32, which are to serve as the edge termination structure 102, and the p-type region 33, which is to serve as an electric field relaxation region. The temperature and duration for the thermal treatment are, for example, approximately 1620° C. and approximately 2 minutes. The order of forming the n-type source region 4, the p-type contact region 5 and the second n-type drift region 12 can be changed in various manners. Note that this collective thermal treatment completes the respective regions.

Figure 11:
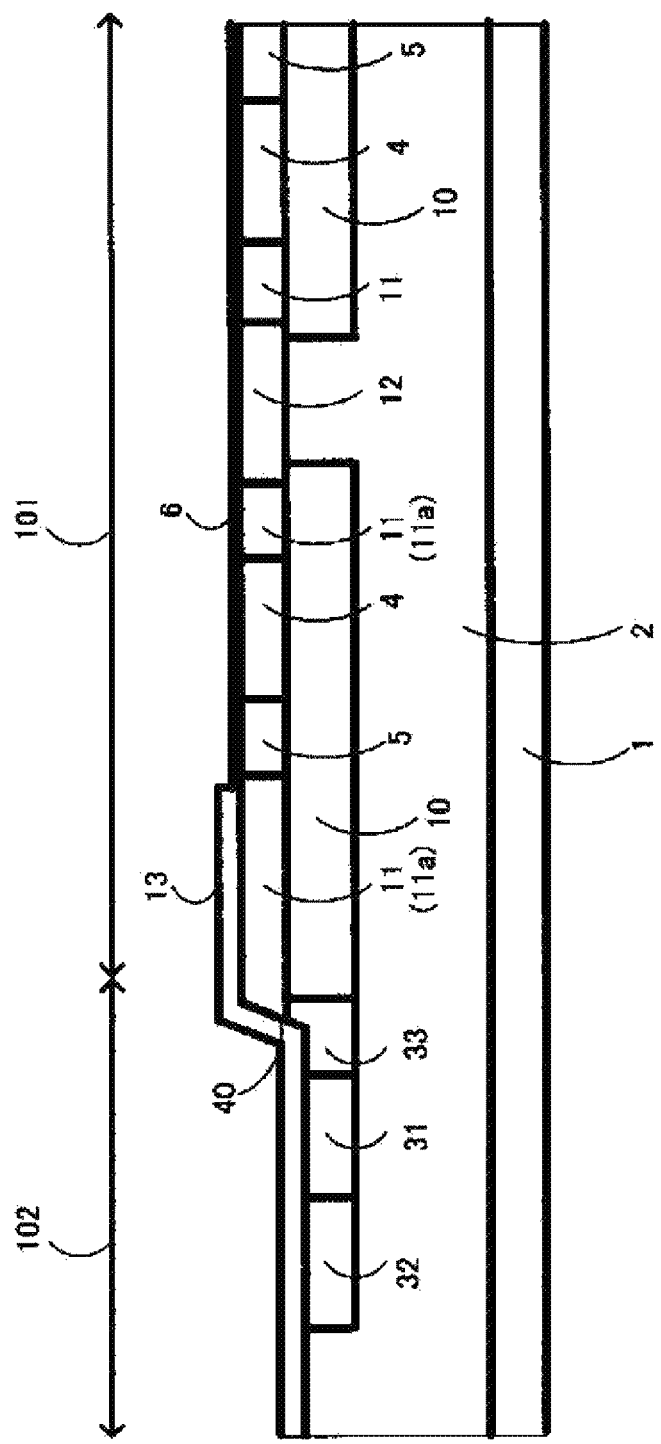
FIG. 11 continues from FIG. 10 and is a cross-sectional view showing a step of manufacturing the main constituents of the silicon carbide semiconductor device 100 relating to the second embodiment of the present invention.

After this, as shown in FIG. 11, the front surface of the p-type silicon carbide epitaxial layer 11a, in which the second p-type base region 11, the n-type source region 4, the p-type contact region 5 and the second n-type drift region 12 are formed, is thermally oxidized, to form the gate insulator 6 (the gate oxide film) having a thickness of approximately 100 nm. The thermal oxidization is thermal treatment performed within a mixed atmosphere of oxygen and hydrogen at the temperature of approximately 1000° C. In this way, the respective regions are covered with the gate insulator 6. At the same time, the insulative film 13 is also formed.

Figure 12:
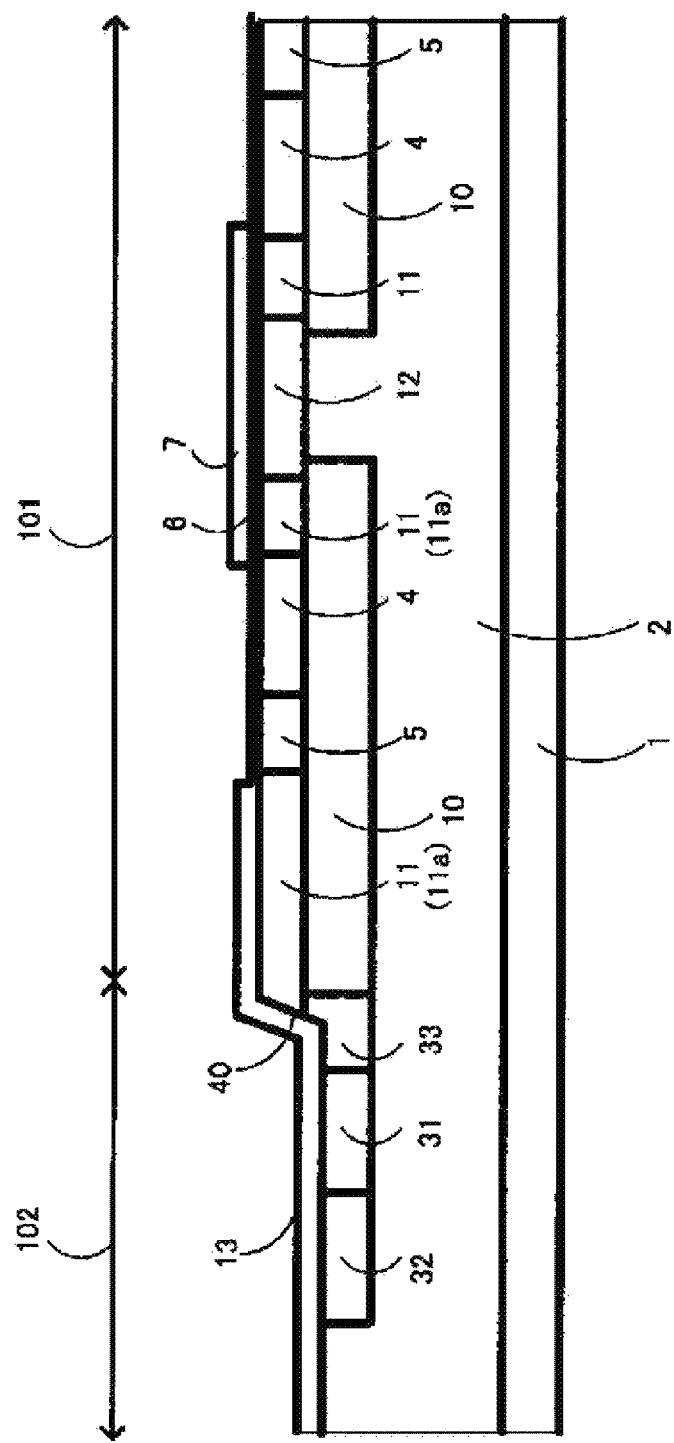
FIG. 12 continues from FIG. 11 and is a cross-sectional view showing a step of manufacturing the main constituents of the silicon carbide semiconductor device 100 relating to the second embodiment of the present invention.

Subsequently, as shown in FIG. 12, a polycrystalline silicon layer doped with, for example, phosphorous (P) is formed on the gate insulator 6. Following this, the polycrystalline silicon layer is patterned and selectively removed to form the gate electrode 7.

Figure 13:
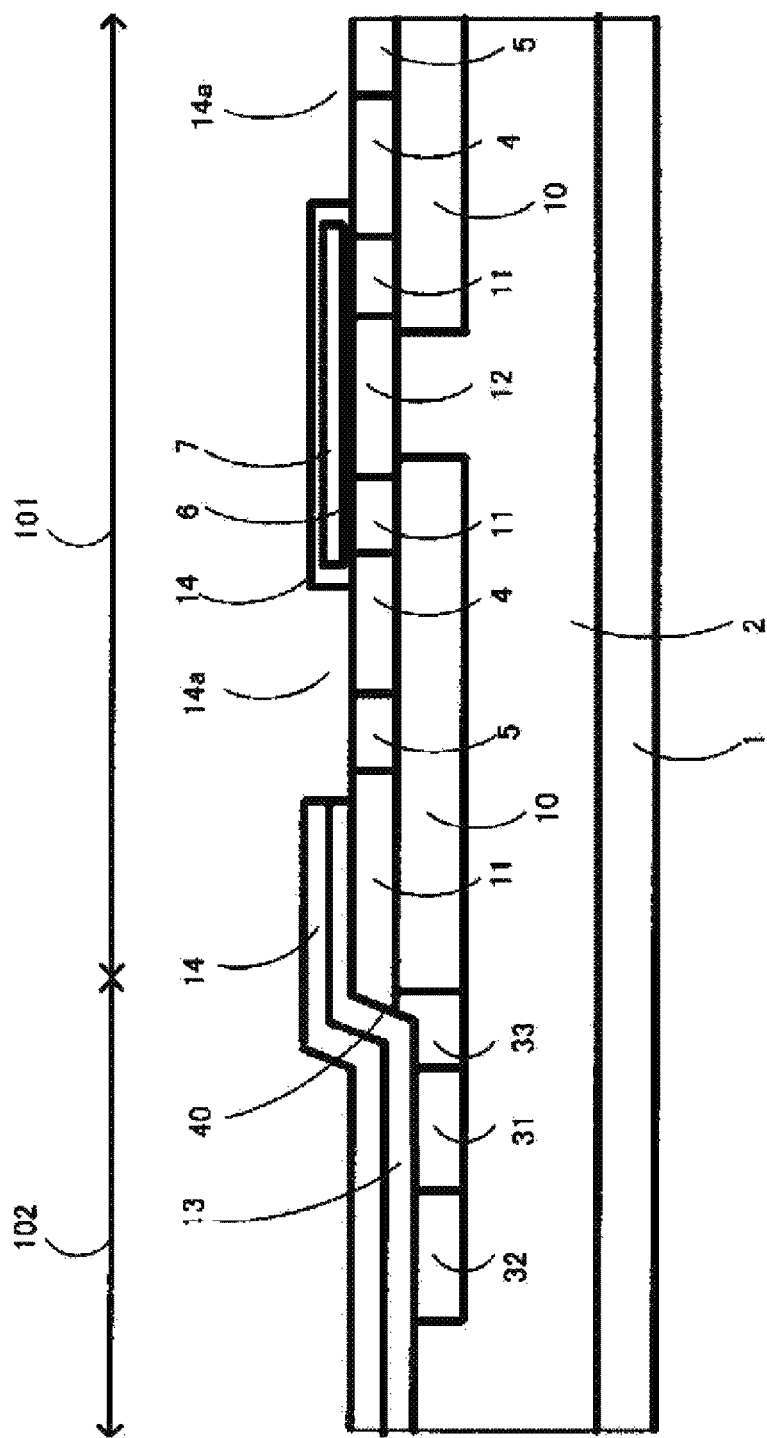
FIG. 13 continues from FIG. 12 and is a cross-sectional view showing a step of manufacturing the main constituents of the silicon carbide semiconductor device 100 relating to the second embodiment of the present invention.

After this, as shown in FIG. 13, the interlayer insulative film 14 is formed to cover the gate electrode 7. For example, phospho silicate glass (PSG) is deposited to have a thickness of approximately 1.0 μm. Subsequently, the interlayer insulative film 14 and the gate insulator 6 are patterned and selectively removed to form the contact hole 14a. As a result, the n-type source region 4 and the p-type contact region 5 are exposed. Following this, thermal treatment (reflow) is performed to flatten the interlayer insulative film 14.

Figure 14:
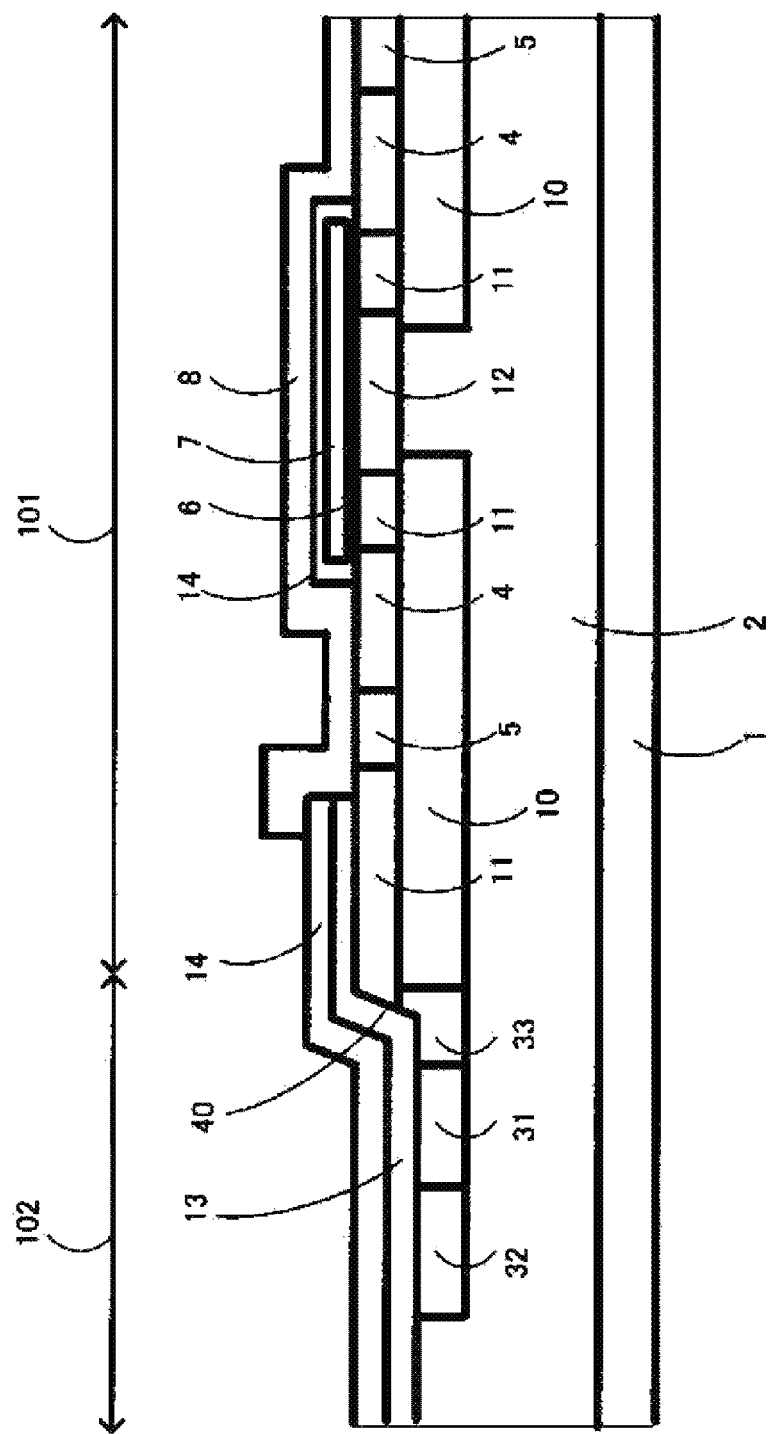
FIG. 14 continues from FIG. 13 and is a cross-sectional view showing a step of manufacturing the main constituents of the silicon carbide semiconductor device 100 relating to the second embodiment of the present invention.

After this, as shown in FIG. 14, photolithography is performed to selectively deposit the source electrode 8. To start with, a nickel film is selectively deposited, for example, in the contact hole as a contact electrode (not shown). Thermal treatment is then performed at the temperature of approximately 970° C., for example, to form ohmic contact between (i) the n-type source region 4 and the p-type contact region 5 and (ii) the contact electrode. Subsequently, the source electrode 8 is embedded, in such a manner that the contact electrode and the source electrode 8 come into contact with each other. The source electrode 8 is formed after the annealing of the contact on the back surface, made of, for example, aluminum containing approximately 1% of silicon (Al—Si) and has a thickness of, for example, approximately 5 μm.

Figure 15:
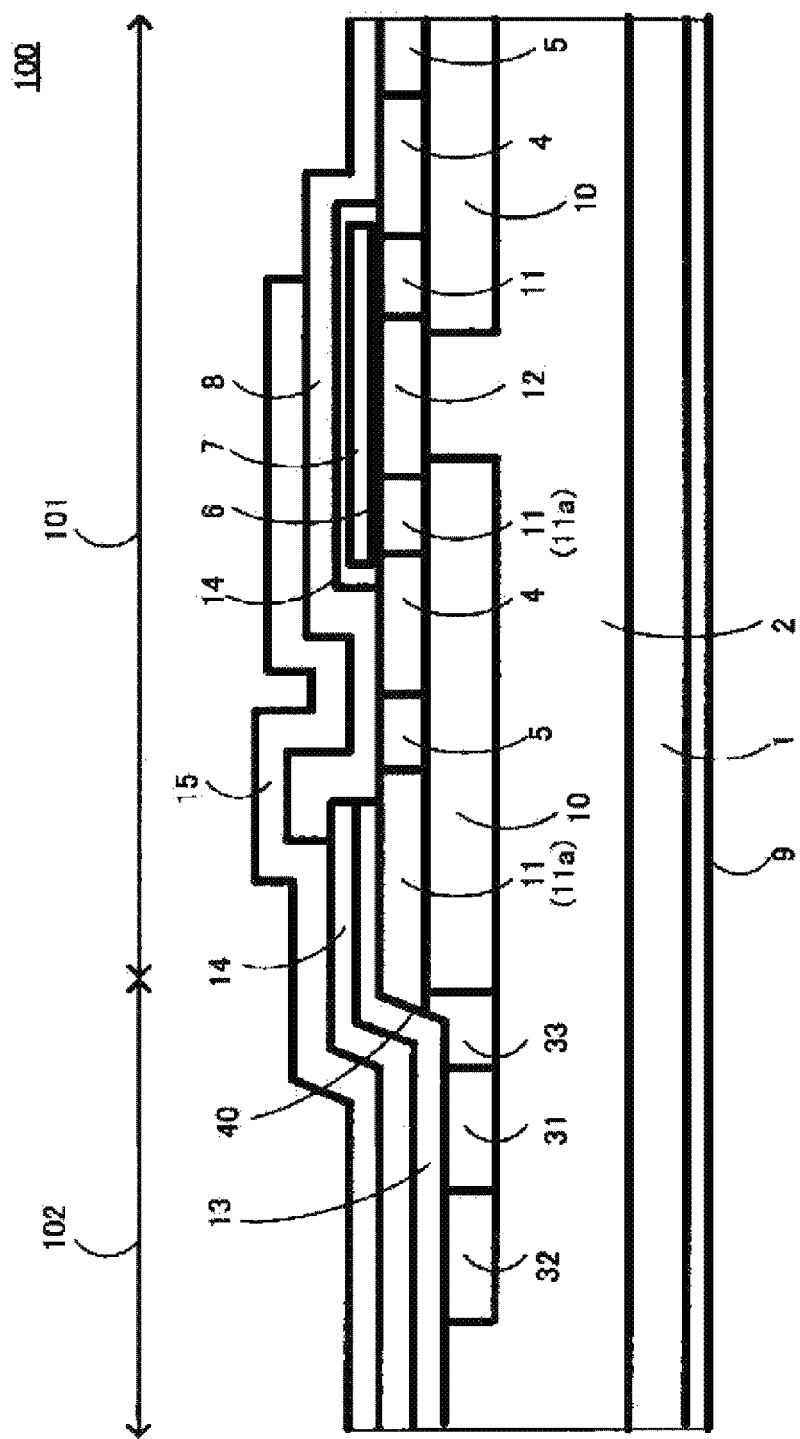
FIG. 15 continues from FIG. 14 and is a cross-sectional view showing a step of manufacturing the main constituents of the silicon carbide semiconductor device 100 relating to the second embodiment of the present invention.

Following this, as shown in FIG. 15, for example, a nickel film is deposited on the back surface of the n-type silicon carbide substrate 1 as a contact electrode. In addition, thermal treatment is performed at the temperature of approximately 970° C., for example, to form ohmic contact between the n-type silicon carbide substrate 1 and the contact electrode. After this, for example, titanium, nickel and gold (Au) are deposited in the stated order to form the drain electrode 9 on the back surface of the contact electrode. Subsequently, the surface protective film 15 is formed to cover the source electrode 8. In this way, the silicon carbide semiconductor device 100 shown in FIG. 1, which is a MOSFET, is completed.

Third Embodiment

FIGS. 16 to 21 collectively show a method of manufacturing a silicon carbide semiconductor device 100 relating to a third embodiment of the present invention, specifically, cross-sectional views showing the steps of manufacturing the main constituents in the performed order.

The third embodiment is different from the second embodiment in that, in the steps shown in FIGS. 5 to 8, the p-type region 33, which is to serve as an electric field relaxation region, is formed after the step-like portion 40 is formed at the edge of the first p-type base region 10. The bottom surface 10a of the first p-type base region is substantially flatly connected to the bottom surface 33a of the p-type region 33.

The steps shown in FIGS. 16 to 21 follow the above-descried step shown in FIG. 4.

Figure 16:
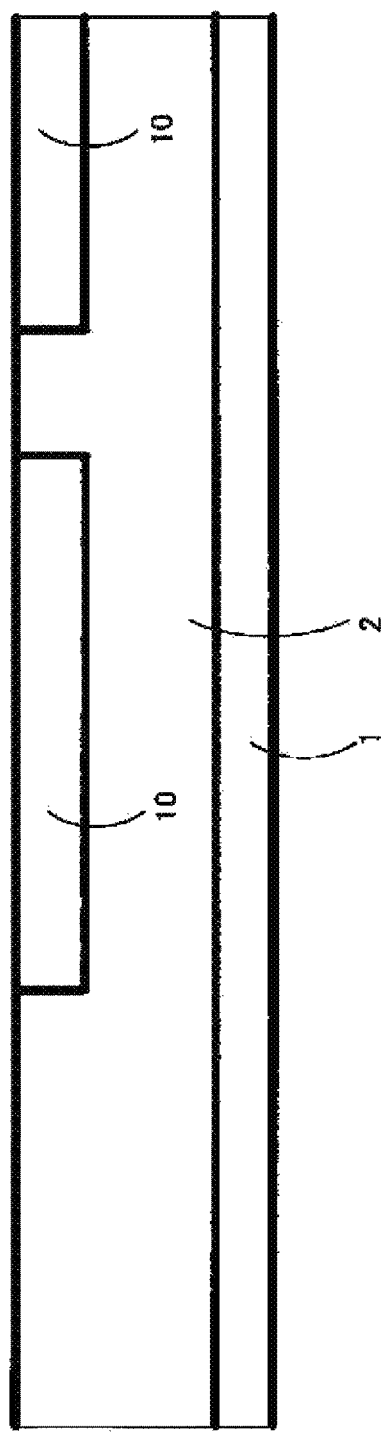
FIG. 16 continues from FIG. 4 and is a cross-sectional view showing a step of manufacturing the main constituents of a silicon carbide semiconductor device 100 relating to a third embodiment of the present invention.
Figure 21:
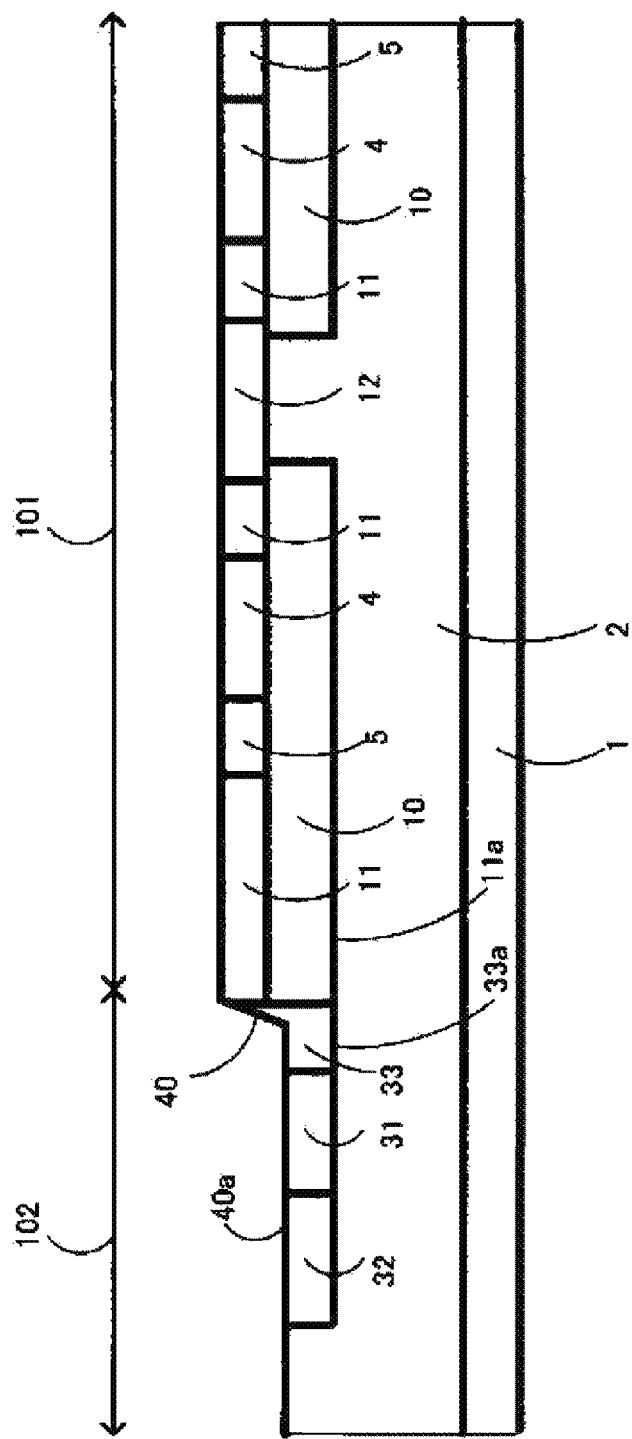
FIG. 21 continues from FIG. 20 and is a cross-sectional view showing a step of manufacturing the main constituents of the silicon carbide semiconductor device 100 relating to the third embodiment of the present invention.
Figure 22:
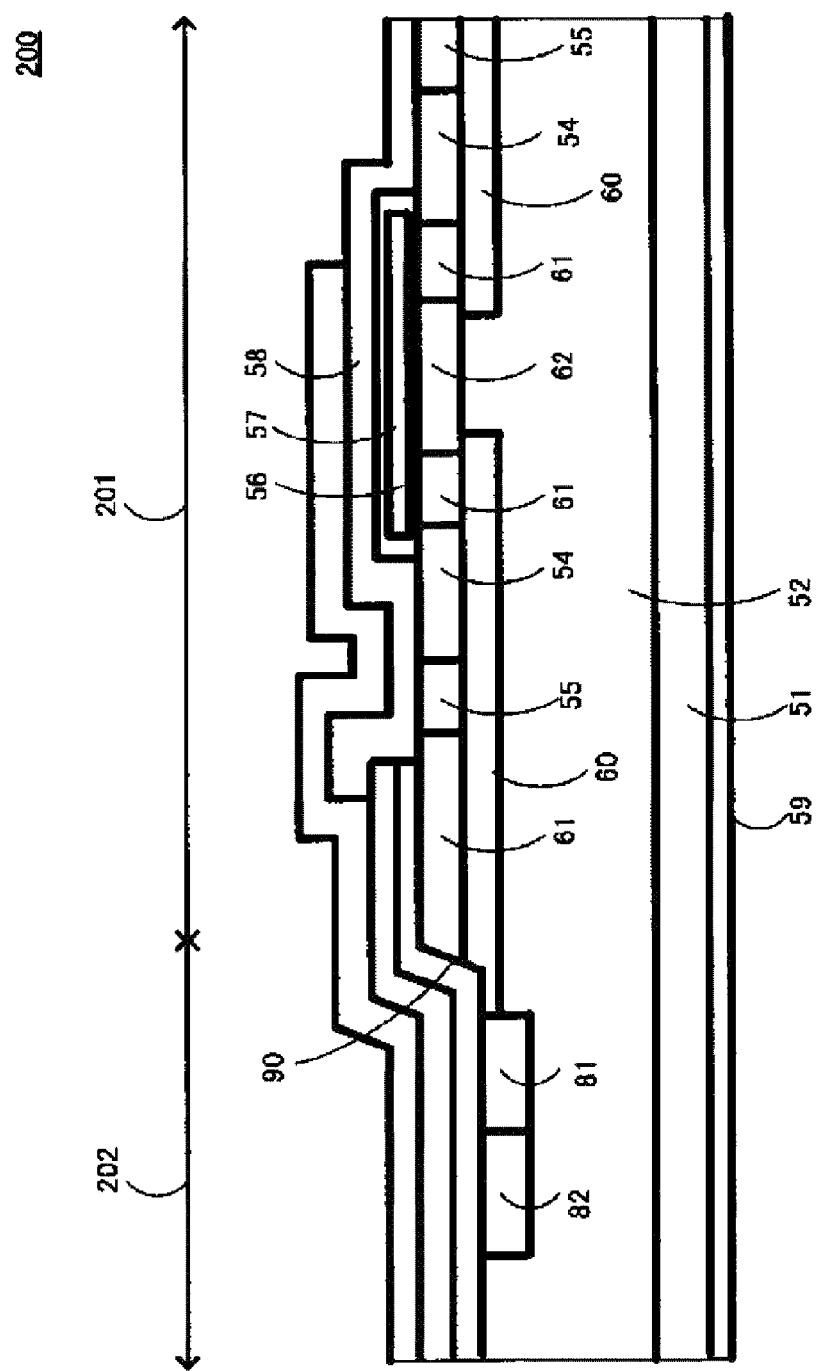
FIG. 22 is a cross-sectional view showing the main constituents of a conventional silicon carbide semiconductor device 200.

As shown in FIG. 16, photolithography, ion implantation and the thermal treatment shown in FIG. 21 are performed to form the first p-type base regions 10, which are to serve as the active region 101, in the front surface layer of the n-type silicon carbide epitaxial layer 2.

Figure 17:
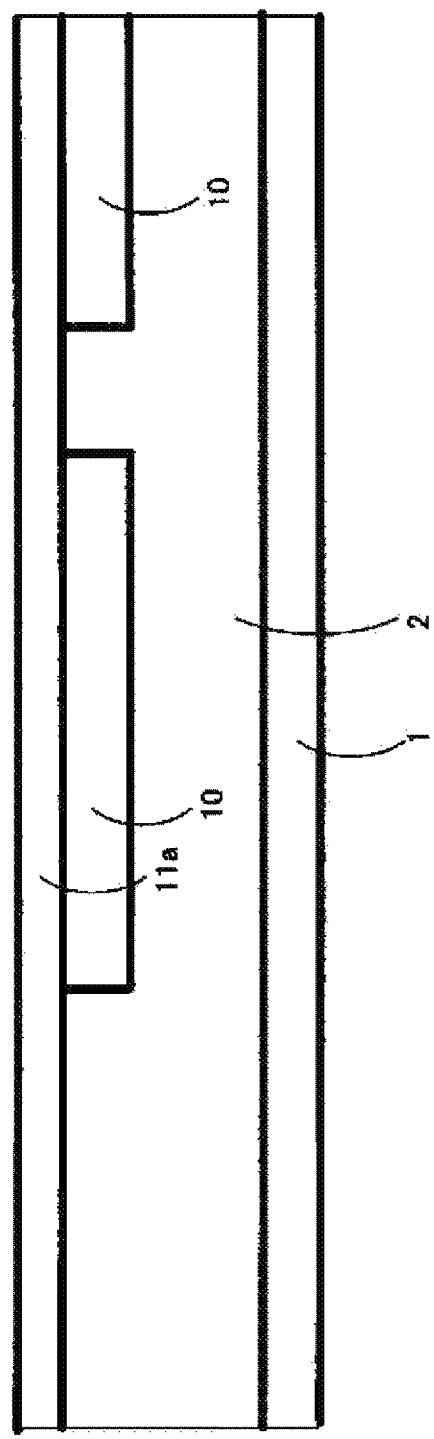
FIG. 17 continues from FIG. 16 and is a cross-sectional view showing a step of manufacturing the main constituents of the silicon carbide semiconductor device 100 relating to the third embodiment of the present invention.

After this, as shown in FIG. 17, the p-type silicon carbide epitaxial layer 11a, which is to serve as the second p-type base region 11, is formed on the front surface of the n-type silicon carbide epitaxial layer 2 in which the first p-type base regions 10 are formed.

Figure 18:
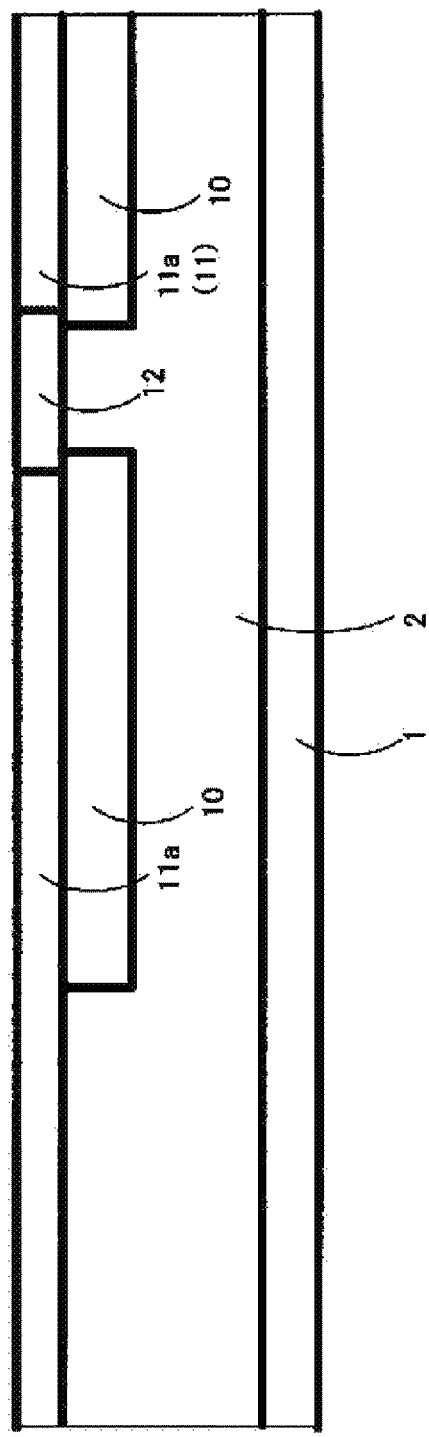
FIG. 18 continues from FIG. 17 and is a cross-sectional view showing a step of manufacturing the main constituents of the silicon carbide semiconductor device 100 relating to the third embodiment of the present invention.

Subsequently, as shown in FIG. 18, photolithography, ion implantation and the thermal treatment shown in FIG. 21 are performed to reverse the conductivity type of a portion of the p-type silicon carbide epitaxial layer 11a that is positioned on the portion of the n-type silicon carbide epitaxial layer 2 that is sandwiched between the first p-type base regions 10 in order to selectively form the second n-type drift region 12.

Figure 19:
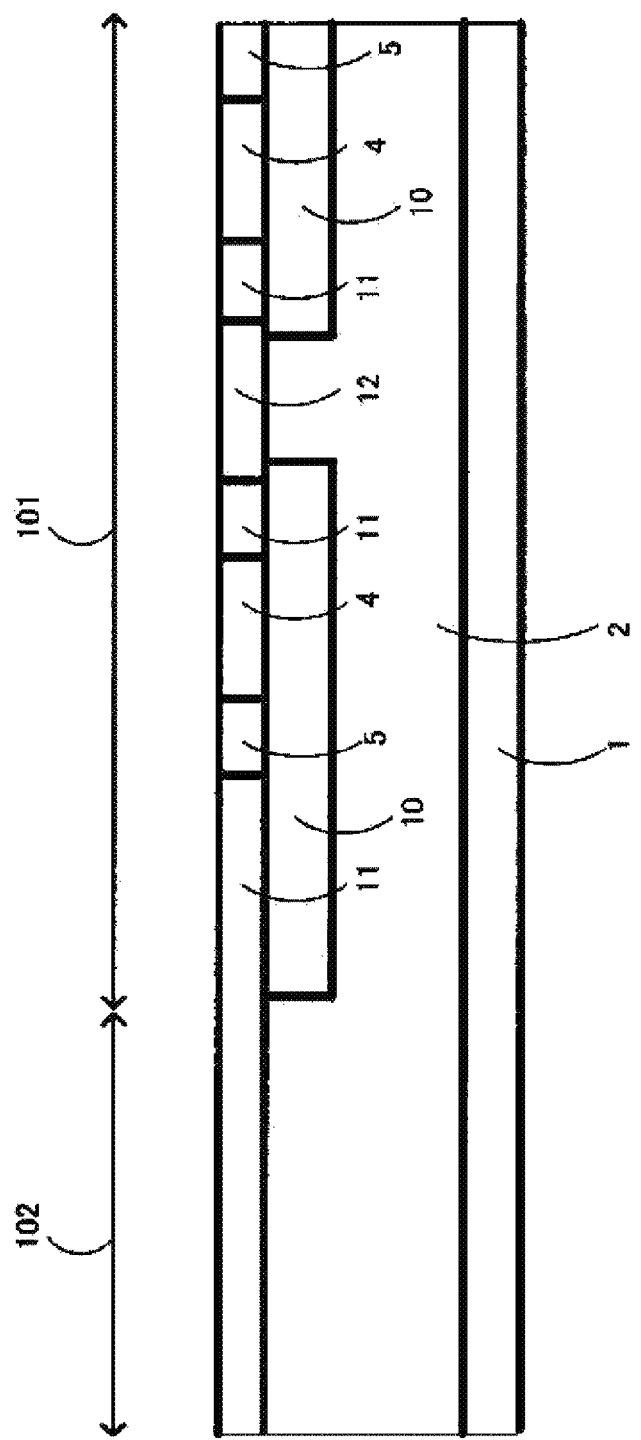
FIG. 19 continues from FIG. 18 and is a cross-sectional view showing a step of manufacturing the main constituents of the silicon carbide semiconductor device 100 relating to the third embodiment of the present invention.

Following this, as shown in FIG. 19, photolithography, ion implantation and the thermal treatment shown in the step of FIG. 21 are performed to selectively form the n-type source region 4, which is spaced away from the second n-type drift region 12, in the p-type silicon carbide epitaxial layer 11a. After this, photolithography and ion implantation are performed to selectively form the p-type contact region 5, which is in contact with the n-type source region 4. The portion of the p-type silicon carbide epitaxial layer 11a in which these regions are not formed is to serve as the second p-type base region 11. In this way, in the direction from the edge termination structure 102 toward the active region 101, the second p-type base region 11, the p-type contact region 5, the n-type source region 4, the second p-type base region 11, the second n-type drift region 12, the second p-type base region 11, the n-type source region 4, the p-type contact region 5, and the second p-type base region 11 are formed in a repeated manner so as to be in contact with each other in the p-type silicon carbide epitaxial layer 11a.

Figure 20:
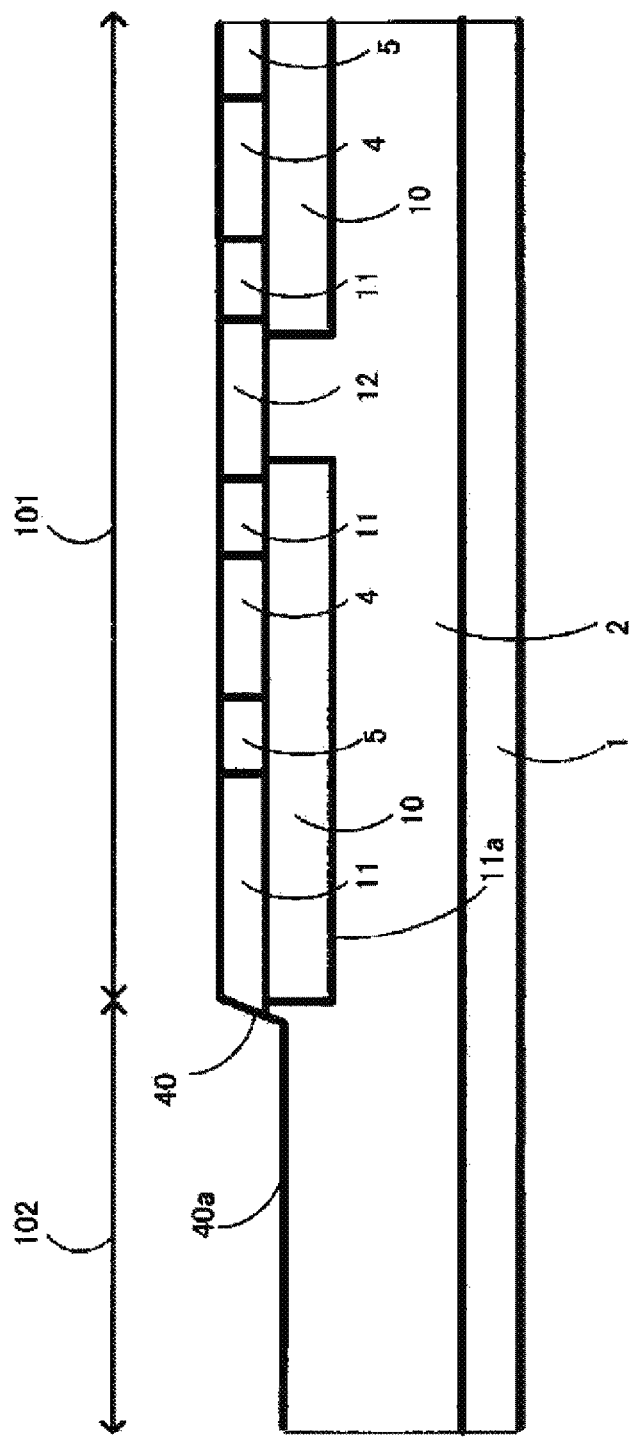
FIG. 20 continues from FIG. 19 and is a cross-sectional view showing a step of manufacturing the main constituents of the silicon carbide semiconductor device 100 relating to the third embodiment of the present invention.

Subsequently, as shown in FIG. 20, in a region outside the edge of the first p-type base region 10, the p-type silicon carbide epitaxial layer 11a (the second p-type base region 11) is subject to etching to form the step-like portion 40.

Following this, as shown in FIG. 21, photolithography, ion implantation and thermal treatment are performed to form the p-type regions 31, 32, which are to serve as the edge termination structure 102, under the bottom surface 40a of the step-like portion 40 and to form the p-type region 33, which is to serve as an electric field relaxation region and connected the p-type region 31 and the first p-type base region 10. Here, the bottom surface 10a of the first p-type base region 10 is substantially flatly connected to the bottom surface 33a of the p-type region 33. For example, the bottom surface 10a of the first p-type base region 10 can be substantially flatly connected to the bottom surface 33a of the p-type region 33 by performing ion implantation with varying accelerating voltage levels on the taper surface of the step-like portion 40.

After the step shown in FIG. 21, the steps shown in FIGS. 11 to 15 are performed.

DESCRIPTION OF REFERENCE NUMERALS 1 n-type silicon carbide substrate
2 n-type silicon carbide epitaxial layer
4 n-type source region
5 p-type contact region
6 gate insulator
7 gate electrode
8 source electrode
9 drain electrode
10 first p-type base region
10a, 33a, 40a bottom surface
11 second p-type base region
11a p-type silicon carbide epitaxial layer
12 second n-type drift region
13 insulative film
14 interlayer insulative film
15 protective film
31, 32 p-type regions (edge termination structure 101)
33 p-type region (electric field relaxation region)
40 step-like portion
51 n-type SiC substrate
52 n-type SiC layer
54 n-type source region
55 p-type contact region
56 gate insulator
57 gate electrode
58 source electrode
59 drain electrode
60 p-type region
61 p-type SiC layer
62 n-type region
81 p-type region
82 p-type region
90 step-like portion
100 silicon carbide semiconductor device 101 active region
102 edge termination structure
200 silicon carbide semiconductor device
201 active region
202 edge termination structure

The invention claimed is:
1. A silicon carbide semiconductor device comprising:
a silicon carbide substrate of a first conductivity type, a first silicon carbide epitaxial layer that is arranged on a front surface of the silicon carbide substrate and configured to serve as a first drift region of the first conductivity type having a lower impurity concentration than the silicon carbide substrate, and a plurality of first base regions of a second conductivity type that are arranged in a front surface layer of the first silicon carbide epitaxial layer;
a plurality of second base regions of the second conductivity type, a source region of the first conductivity type, and a contact region of the second conductivity type, the second base regions, the source region and the contact region being arranged on the first base regions, the contact region having a higher impurity concentration than the second base regions;
a second drift region of the first conductivity type that is sandwiched between the second base regions and arranged on a portion of the first silicon carbide epitaxial layer sandwiched between the first base regions;
a gate electrode that is positioned on a portion of the second base region sandwiched between the source region and the second drift region with a gate insulator being placed between the second base region and the gate electrode, a source electrode that is electrically connected to the source region and the contact region, and a drain electrode that is electrically connected to the silicon carbide substrate;
a step-like portion that is provided at a peripheral portion of the second base regions and located deeper than a bottom surface of the second base regions and shallower than a bottom surface of the first base regions;
a first semiconductor region of the second conductivity type that is arranged in the front surface layer of the first silicon carbide epitaxial layer and is in contact with the step-like portion, the second base region and the first base regions;
a second semiconductor region of the second conductivity type that is arranged in the front surface layer of the first silicon carbide epitaxial layer, positioned under a bottom surface of the step-like portion and is in contact with the first semiconductor region; and
a third semiconductor region of the second conductivity type that is arranged in the front surface layer of the first silicon carbide epitaxial layer, positioned under the bottom surface of the step-like portion and is in contact with the second semiconductor region, wherein
a bottom surface of the first semiconductor region and the bottom surface of the first base regions are substantially flatly connected together, the first semiconductor region, the second semiconductor region and the third semiconductor region have a lower impurity concentration than the first base regions, the first semiconductor region has a higher impurity concentration than the second semiconductor region and the third semiconductor region, and the first base regions have an impurity concentration of no less than $4\times10^{17}$ cm$^{-3}$ and no more than $1\times10^{18}$ cm$^{-3}$.

2. The silicon carbide semiconductor device as set forth in claim 1, wherein
differences among depths of the bottom surfaces of the first base regions, the first semiconductor region, the second semiconductor region and the third semiconductor region are within a range of +−0.1 μm.

3. The silicon carbide semiconductor device as set forth in claim 1, wherein
the first semiconductor region has an impurity concentration of no less than $2\times10^{16}$ cm$^{-3}$ and no more than $1\times10^{17}$ cm$^{-3}$.

4. The silicon carbide semiconductor device as set forth in claim 1, wherein
the second semiconductor region and the third semiconductor region have an impurity concentration of no less than $1\times10^{16}$ cm$^{-3}$ and no more than $9\times10^{16}$ cm$^{-3}$.

5. A method of manufacturing a silicon carbide semiconductor device comprising:
forming a plurality of first base regions of a second conductivity type, a first semiconductor region of the second conductivity type, a second semiconductor region of the second conductivity type, and a third semiconductor region of the second conductivity type in such a manner that the first base regions, the first semiconductor region, the second semiconductor region and the third semiconductor region are in contact with each other by performing selective ion implantation on a front surface layer of a first silicon carbide epitaxial layer of a first conductivity type, the first silicon carbide epitaxial layer being configured to serve as a first drift region, and forming the first semiconductor region and the first base regions in such a manner that a bottom surface of the first semiconductor region is substantially flatly connected to a bottom surface of the first base regions;
forming a second silicon carbide epitaxial layer of the second conductivity type on the first silicon carbide epitaxial layer;
forming a source region of the first conductivity type and a contact region of the second conductivity type by performing selective ion implantation on a portion of the second silicon carbide epitaxial layer that is positioned on the first base regions, forming a second drift region of the first conductivity type by performing ion implantation on a portion of the second silicon carbide epitaxial layer that is positioned on a portion of the first silicon carbide epitaxial layer sandwiched between the first base regions, and treating a portion of the second silicon carbide epitaxial layer that is not exposed to the ion implantation as a second base region; and
etching away a portion of the second silicon carbide epitaxial layer that is formed on the first semiconductor region, the second semiconductor region, the third semiconductor region and a peripheral portion of the first silicon carbide epitaxial layer and forming a step-like portion in the first semiconductor region, the step-like portion being located deeper than a bottom surface of the second silicon carbide epitaxial layer and shallower than a bottom surface of the first base region, wherein
the first semiconductor region, the second semiconductor region and the third semiconductor region have a lower impurity concentration than the first base regions, the first semiconductor region has a higher impurity concentration than the second semiconductor region and the third semiconductor region, and the first base regions have an impurity concentration of no less than $4\times10^{17}$ cm$^{-3}$ and no more than $1\times10^{18}$ cm$^{-3}$.

6. A method of manufacturing a silicon carbide semiconductor device comprising:

forming a plurality of first base regions of a second conductivity type, a second semiconductor region of a second conductivity type spaced away from the first base regions and a third semiconductor region of the second conductivity type adjacent to the second semiconductor region by performing selective ion implantation on a front surface layer of a first silicon carbide epitaxial layer of a first conductivity type, the first silicon carbide epitaxial layer being configured to serve as a first drift region;

forming a second silicon carbide epitaxial layer of the second conductivity type on the first silicon carbide epitaxial layer;

forming a source region of the first conductivity type and a contact region of the second conductivity type by performing selective ion implantation on a portion of the second silicon carbide epitaxial layer that is positioned on the first base regions, forming a second drift region of the first conductivity type by performing ion implantation on a portion of the second silicon carbide epitaxial layer that is positioned on a portion of the first silicon carbide epitaxial layer sandwiched between the first base regions, and treating a portion of the second silicon carbide epitaxial layer that is not exposed to the ion implantation as a second base region;

etching away a portion of the second silicon carbide epitaxial layer that is more outside than an edge of the first base regions and forming a step-like portion that is positioned between the first base regions and the second semiconductor region, the step-like portion being located deeper than a bottom surface of the second silicon carbide epitaxial layer and shallower than a bottom surface of the first base regions; and forming a first semiconductor region in a portion of a front surface layer of the first silicon carbide epitaxial layer that is positioned under the step-like portion, the first semiconductor region being connected to the first base regions, the second base region and the second semiconductor region and a bottom surface of the first semiconductor region being substantially flatly connected to the bottom surface of the first base regions, wherein the first semiconductor region, the second semiconductor region and the third semiconductor region have a lower impurity concentration than the first base regions, the first semiconductor region has a higher impurity concentration than the second semiconductor region and the third semiconductor region, and the first base regions have an impurity concentration of no less than $4\times10^{17}$ cm$^{-3}$ and no more than $1\times10^{18}$ cm$^{-3}$.

* * * * *